(12) United States Patent
Nakamura et al.

(10) Patent No.: US 10,299,376 B2
(45) Date of Patent: May 21, 2019

(54) ELECTRICAL WIRING MEMBER PRODUCTION METHOD, ELECTRICAL WIRING MEMBER FORMING MATERIAL, ELECTRICAL WIRING MEMBER, ELECTRICAL WIRING BOARD PRODUCTION METHOD, ELECTRICAL WIRING BOARD FORMING MATERIAL, ELECTRICAL WIRING BOARD, VIBRATOR, ELECTRONIC APPARATUS, AND MOVING OBJECT

(71) Applicant: Seiko Epson Corporation, Tokyo (JP)

(72) Inventors: Hidefumi Nakamura, Hachinohe (JP); Taku Kawasaki, Hachinohe (JP)

(73) Assignee: Seiko Epson Corporation (JP)

( * ) Notice: Subject to any disclaimer, the term of this patent is extended or adjusted under 35 U.S.C. 154(b) by 358 days.

(21) Appl. No.: 15/098,679

(22) Filed: Apr. 14, 2016

(65) Prior Publication Data

US 2016/0309585 A1  Oct. 20, 2016

(30) Foreign Application Priority Data

Apr. 20, 2015 (JP) ................................. 2015-086199

(51) Int. Cl.
*H05K 1/03* (2006.01)
*H05K 1/02* (2006.01)
(Continued)

(52) U.S. Cl.
CPC ............. *H05K 1/0296* (2013.01); *B22F 1/02* (2013.01); *B22F 3/02* (2013.01); *H01B 1/22* (2013.01);
(Continued)

(58) Field of Classification Search
CPC ... H05K 1/03; H05K 1/09; H05K 1/11; H05K 1/18; H05K 3/10; H05K 3/46; H05H 3/46;
(Continued)

(56) References Cited

U.S. PATENT DOCUMENTS

2002/0039667 A1  4/2002  Takaya et al.
2004/0031147 A1*  2/2004  Kawashima ........... H05K 3/462
29/852
(Continued)

FOREIGN PATENT DOCUMENTS

JP  10-303061 A  11/1998
JP  2000-207936 A  7/2000
(Continued)

OTHER PUBLICATIONS

Extended European Search Report for Application No. EP 16 16 5747 dated Sep. 23, 2016 (10 pages).

*Primary Examiner* — Xiaoling Chen
(74) *Attorney, Agent, or Firm* — Harness, Dickey & Pierce, P.L.C.

(57) ABSTRACT

A method for producing an electrical wiring member includes press-molding a composition containing a resin material and metal particles with an insulating layer, each of which is constituted by a metal particle and a surface insulating layer covering the metal particle and containing a glass material as a main material, thereby obtaining a powder-compacted layer and irradiating the powder-compacted layer with an energy beam, thereby causing the irradiated regions to exhibit electrical conductivity.

9 Claims, 17 Drawing Sheets

(51) Int. Cl.
*H01B 19/00* (2006.01)
*H05K 3/22* (2006.01)
*H03H 9/10* (2006.01)
*H01B 1/22* (2006.01)
*B22F 1/02* (2006.01)
*B22F 3/02* (2006.01)
*H05K 3/10* (2006.01)
*H05K 3/40* (2006.01)
*H05K 3/12* (2006.01)

(52) U.S. Cl.
CPC ............ *H01B 19/00* (2013.01); *H03H 9/10* (2013.01); *H05K 1/0373* (2013.01); *H05K 3/105* (2013.01); *H05K 3/22* (2013.01); *H05K 3/4038* (2013.01); *H05K 3/1216* (2013.01); *H05K 2201/0224* (2013.01); *H05K 2201/09118* (2013.01); *H05K 2203/0278* (2013.01); *H05K 2203/107* (2013.01); *H05K 2203/1126* (2013.01); *H05K 2203/1131* (2013.01); *H05K 2203/1136* (2013.01); *H05K 2203/1461* (2013.01)

(58) Field of Classification Search
CPC .......... B22F 3/105; H01L 41/29; H01L 41/47; H01L 41/53; G02F 1/13; G02F 1/139; G02F 1/1335

USPC ........... 174/256, 258, 262; 310/344; 29/852; 430/319; 349/12, 63, 86, 201
See application file for complete search history.

(56) References Cited

U.S. PATENT DOCUMENTS

| | | | |
|---|---|---|---|
| 2007/0212564 A1* | 9/2007 | Sasaki | B22F 1/02 428/570 |
| 2015/0070855 A1* | 3/2015 | Miyao | H05K 3/388 361/748 |
| 2015/0188024 A1* | 7/2015 | Ishigami | H01L 41/0475 310/344 |
| 2016/0086687 A1* | 3/2016 | Ishizawa | H05K 3/323 174/262 |

FOREIGN PATENT DOCUMENTS

| | | |
|---|---|---|
| JP | 2002-060807 A | 2/2002 |
| JP | 2004-149817 A | 5/2004 |
| JP | 2009-295661 A | 12/2009 |
| JP | 2013-041683 A | 2/2013 |
| JP | 2014-222611 A | 11/2014 |

* cited by examiner

ELECTRICAL WIRING MEMBER PRODUCTION METHOD, ELECTRICAL WIRING MEMBER FORMING MATERIAL, ELECTRICAL WIRING MEMBER, ELECTRICAL WIRING BOARD PRODUCTION METHOD, ELECTRICAL WIRING BOARD FORMING MATERIAL, ELECTRICAL WIRING BOARD, VIBRATOR, ELECTRONIC APPARATUS, AND MOVING OBJECT

CROSS-REFERENCE TO RELATED APPLICATIONS

This application claims priority to Japanese Patent Application No. 2015-086199 filed on Apr. 20, 2015. The entire disclosures of Japanese Patent Application No. 2015-086199 is hereby incorporated herein by reference.

BACKGROUND

1. Technical Field

The present invention relates to an electrical wiring member production method, an electrical wiring member forming material, an electrical wiring member, an electrical wiring board production method, an electrical wiring board forming material, an electrical wiring board, a vibrator, an electronic apparatus, and a moving object.

2. Related Art

A ceramic wiring board is superior to an organic wiring board in terms of thermal conductivity, heat resistance, chemical stability, and the like, and therefore can increase the density of the wiring board and contributes to the miniaturization of an electronic apparatus.

As such a ceramic wiring board, for example, there has been known a wiring board which includes a ceramic substrate, a ground pattern laid on the surface of the ceramic substrate and composed of W or Mo, and a wiring pattern provided on the surface of the ground pattern and composed of Cu (see, for example, JP-A-2009-295661 (PTL 1)).

The ceramic wiring board disclosed in PTL 1 is produced through a step of applying an electrically conductive paste containing W or Mo as a main component to the front or back surface of a ceramic molded body obtained by mixing a ceramic powder material and an organic binder, a step of obtaining a ceramic substrate having a ground pattern formed thereon by simultaneously firing the ceramic molded body and the electrically conductive paste, and a step of obtaining a wiring pattern by depositing Cu on the surface of the ground pattern by a plating method.

In such a ceramic wiring board, a ground pattern is provided between a ceramic substrate and a wiring pattern so as to ensure the adhesiveness of both members. However, since it is necessary to form the ground pattern, the number of production steps is increased, and therefore, there is a problem that the production efficiency is low.

On the other hand, if the ground pattern is not provided, the adhesiveness of the ceramic substrate to the wiring pattern is decreased, and therefore, it is concerned that a problem such as the peeling-off of the wiring pattern may occur.

On the other hand, JP-A-10-303061 (PTL 2) proposes a capacitor using a removal processing electrode (trimming electrode) for removing an insulating material with heating-inducible electrical conductivity in which electrically conductive particles are dispersed in a thermoplastic insulating material. In this capacitor, when the removal processing electrode is irradiated with a laser, the thermoplastic insulating material and the electrically conductive particles are melted, and further, the electrically conductive particles are connected to each other, whereby the irradiated region can be made to be electrically conductive. That is, in the removal processing electrode, the electrically conductive particles are initially insulated from each other by the thermoplastic insulating material. However, by irradiation with a laser, the irradiated region is made to be electrically conductive. Due to this, PTL 2 discloses that by irradiation with a laser, the capacitance of the capacitor can be adjusted.

Therefore, by forming a coating film on a ceramic substrate using an insulating material with heating-inducible electrical conductivity disclosed in PTL 2 and irradiating the coating film with a laser, a wiring pattern corresponding to the irradiation mark can be formed.

However, PTL 2 discloses that as the thermoplastic insulating material, pine resin, various types of rubbers, thermoplastic synthetic resins, and the like are used. These materials have low heat resistance, and therefore, for example, when soldering is performed on the formed wiring pattern, the insulating material with heating-inducible electrical conductivity cannot withstand the temperature of the soldering. Due to this, the insulating material with heating-inducible electrical conductivity in a region which is not irradiated with a laser is also undesirably made to be electrically conductive accompanying soldering, and therefore, a problem such as a decrease in insulating properties between the wiring patterns occurs.

SUMMARY

An advantage of some aspects of the invention is to provide an electrical wiring member having an electrical wiring with a desired pattern formed therein, an electrical wiring member production method capable of efficiently producing this electrical wiring member, an electrical wiring member forming material to be favorably used for forming the electrical wiring member, an electrical wiring board including an electrical wiring having a desired pattern provided on a substrate, an electrical wiring board production method capable of efficiently producing this electrical wiring board, an electrical wiring board forming material to be favorably used for forming the electrical wiring board, and a vibrator, an electronic apparatus, and a moving object, each of which includes the electrical wiring member or the electrical wiring board.

An electrical wiring member production method according to an aspect of the invention is a method for producing an electrical wiring member including an electrical wiring, and includes molding a composition containing a resin material and metal particles with an insulating layer, each of which is constituted by a metal particle having electrical conductivity and a surface insulating layer located on the surface of the metal particle and containing a glass material as a main material, thereby obtaining a molded body, and irradiating the molded body with an energy beam, thereby forming the electrical wiring in the irradiated region.

According to this configuration, by appropriately selecting a region to be irradiated with an energy beam, an electrical wiring having a desired pattern can be easily formed. Due to this, an electrical wiring member can be efficiently produced. Further, an insulating region is obtained in a non-irradiated region, however, this insulating region contains metal particles and therefore has high thermal conductivity derived from the metal material. As a result, the electrical wiring member to be produced according to the aspect of the invention has excellent heat dissipation.

In the electrical wiring member production method according to the aspect of the invention, it is preferred that the metal particles with an insulating layer are produced by attaching the glass material to the surface of each metal particle.

According to this configuration, the metal particles with an insulating layer can be produced under dry conditions and in an inert gas, and therefore, a possibility that water or the like is interposed between the metal particle and the surface insulating layer is decreased, and thus, degeneration or deterioration of the metal particles can be suppressed over a long period of time. Further, since the glass material is mechanically attached to the surface of the metal particle, even if a foreign matter, an oxide coating film, or the like is adhered to the surface of the metal particle, the surface insulating layer can be formed while removing or destroying such a material. As a result, the metal particles with an insulating layer have high cleanliness, and an electrical wiring having high electrical conductivity is obtained. Also a glass material which has a high softening point and is difficult to handle can be formed into a coating film as the surface insulating layer. Due to this, a wide variety of glass materials can be used.

In the electrical wiring member production method according to the aspect of the invention, it is preferred that the molded body is obtained by pressurizing a mixture of the metal particles with an insulating layer and the resin material.

According to this configuration, a distance between the metal particles in the molded body is decreased, and when an energy beam is irradiated, the resolution at the boundary between the irradiated region and the non-irradiated region is increased. As a result, a high-definition electrical wiring can be formed.

In the electrical wiring member production method according to the aspect of the invention, it is preferred that the metal particles are produced by a water atomization method or a spinning water atomization method.

According to this configuration, an extremely fine powder can be efficiently produced, and also the shape of the particle of the obtained powder is close to a spherical shape by the action of surface tension, and therefore, metal particles capable of increasing the filling factor when molding are obtained.

In the electrical wiring member production method according to the aspect of the invention, it is preferred that the resin material contains an epoxy-based resin.

According to this configuration, an electrical wiring member having high insulating properties in an insulating region and also having excellent mechanical characteristics can be produced.

An electrical wiring member forming material according to an aspect of the invention is a material which includes a resin material and metal particles with an insulating layer, each of which is constituted by a metal particle having electrical conductivity and a surface insulating layer located on the surface of the metal particle and containing a glass material as a main material, and is molded into a predetermined shape, wherein by irradiating a portion of the material with an energy beam, electrical conductivity is exhibited in the irradiated region so as to be able to form an electrical wiring.

According to this configuration, an electrical wiring having a desired pattern can be easily formed only by irradiating an arbitrary region with an energy beam. Due to this, an electrical wiring member forming material to be favorably used for forming an electrical wiring member is obtained.

An electrical wiring member according to an aspect of the invention includes an insulating region containing a resin material and metal particles with an insulating layer, each of which is constituted by a metal particle having electrical conductivity and a surface insulating layer located on the surface of the metal particle and containing a glass material as a main material, and an electrical wiring containing a particle-bonded body in which metal particles having electrical conductivity are bonded to each other, wherein the insulating region and the electrical wiring are integrally formed.

According to this configuration, the insulating region and the electrical wiring are rigidly connected to each other, and the mechanical strength at the boundary between the electrical wiring and the insulating region is sufficiently increased, and therefore, an electrical wiring member capable of sufficiently suppressing the occurrence of a problem such as the peeling-off of the electrical wiring is obtained.

An electrical wiring board production method according to an aspect of the invention is a method for producing an electrical wiring board having a substrate and an electrical wiring member provided on one surface side of the substrate and including an electrical wiring, and includes molding a composition containing a resin material and metal particles with an insulating layer, each of which is constituted by a metal particle having electrical conductivity and a surface insulating layer located on the surface of the metal particle and containing a glass material as a main material, thereby obtaining a molded body on the substrate, and irradiating the molded body with an energy beam to form the electrical wiring in the irradiated region, thereby obtaining the electrical wiring member.

According to this configuration, by appropriately selecting a region to be irradiated with an energy beam, an electrical wiring having a desired pattern can be easily formed. Due to this, an electrical wiring board can be efficiently produced. Further, an insulating region is obtained in a non-irradiated region, however, this insulating region contains metal particles and therefore has high thermal conductivity derived from the metal material. As a result, the electrical wiring board to be produced according to the aspect of the invention has excellent heat dissipation.

An electrical wiring board forming material according to an aspect of the invention is a material which includes a substrate, and a molded body provided on one surface side of the substrate and containing a resin material and metal particles with an insulating layer, each of which is constituted by a metal particle having electrical conductivity and a surface insulating layer located on the surface of the metal particle and containing a glass material as a main material, and is capable of forming an electrical wiring by irradiating a portion of the molded body with an energy beam so as to exhibit electrical conductivity in the irradiated region.

According to this configuration, an electrical wiring having a desired pattern can be easily formed only by irradiating an arbitrary region with an energy beam. Due to this, an electrical wiring board forming material to be favorably used for forming an electrical wiring board is obtained.

An electrical wiring board according to an aspect of the invention includes a substrate, and an electrical wiring member provided on one surface side of the substrate and including an insulating region containing a resin material and metal particles with an insulating layer, each of which is constituted by a metal particle having electrical conductivity and a surface insulating layer located on the surface of the metal particle and containing a glass material as a main material, and an electrical wiring containing a particle-bonded body in which metal particles having electrical conductivity are bonded to each other, wherein the insulating region and the electrical wiring are integrally formed in the electrical wiring member.

According to this configuration, the insulating region and the electrical wiring are rigidly connected to each other, and the mechanical strength at the boundary between the electrical wiring and the insulating region is sufficiently increased, and therefore, an electrical wiring board capable of sufficiently suppressing the occurrence of a problem such as the peeling-off of the electrical wiring is obtained.

A vibrator according to an aspect of the invention includes a package including the electrical wiring member according to the aspect of the invention or the electrical wiring board according to the aspect of the invention and a lid member bonded to the electrical wiring member or the electrical wiring board, and a vibrating reed housed in the package.

According to this configuration, a vibrator capable of achieving miniaturization and cost reduction is obtained.

An electronic apparatus according to an aspect of the invention includes the electrical wiring member according to the aspect of the invention or the electrical wiring board according to the aspect of the invention.

According to this configuration, an electronic apparatus including the electrical wiring member or the electrical wiring board having high reliability is obtained.

A moving object according to an aspect of the invention includes the electrical wiring member according to the aspect of the invention or the electrical wiring board according to the aspect of the invention.

According to this configuration, a moving object including the electrical wiring member or the electrical wiring board having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electrical wiring member production method, an electrical wiring member forming material, an electrical wiring member, an electrical wiring board production method, an electrical wiring board forming material, an electrical wiring board, a vibrator, an electronic apparatus, and a moving object according to the invention will be described in detail with reference to preferred embodiments shown in the accompanying drawings.

Vibrator and Electrical Wiring Member

First Embodiment

First, a vibrator (a first embodiment of a vibrator according to the invention) will be described as an example of a device to which an electrical wiring member according to the invention is applied, and also a first embodiment of the electrical wiring member according to the invention included therein will be described.

Figure 1:
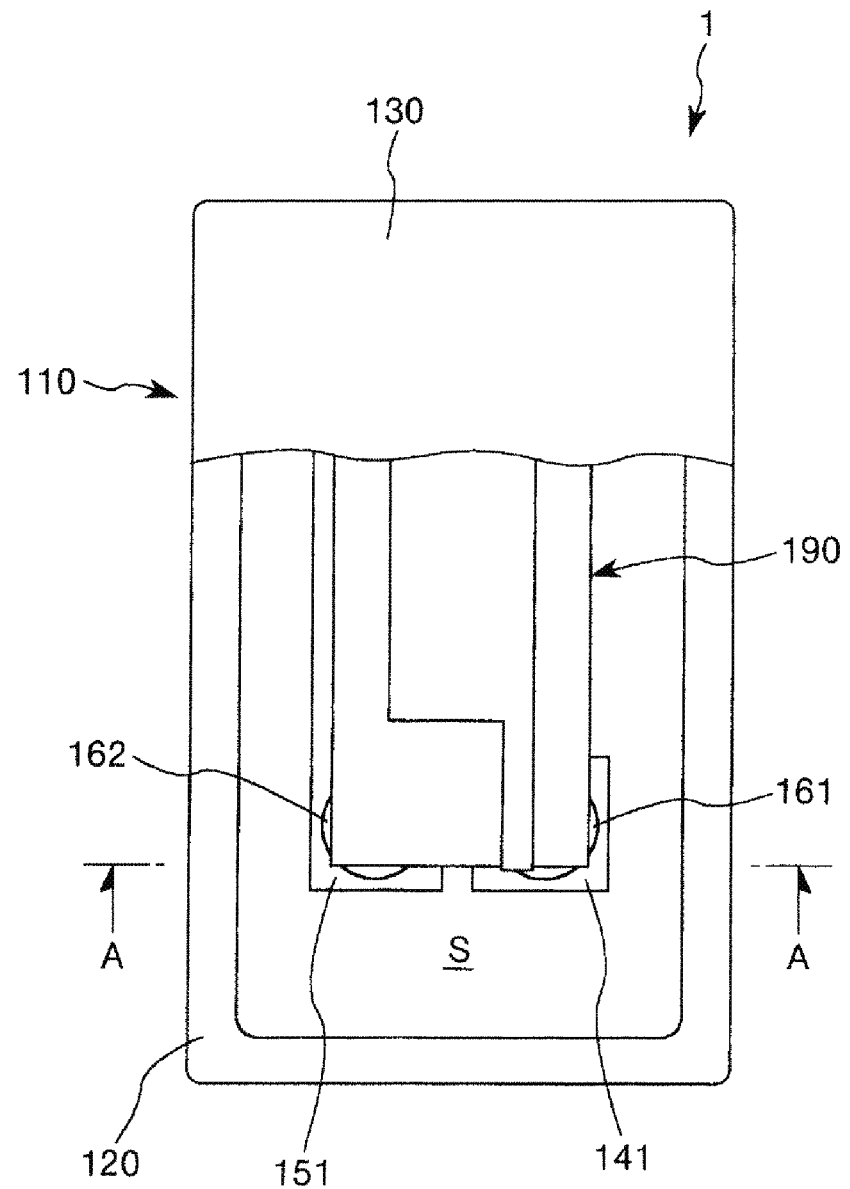
FIG. 1 is a plan view showing a first embodiment of a vibrator according to the invention.
Figure 2:
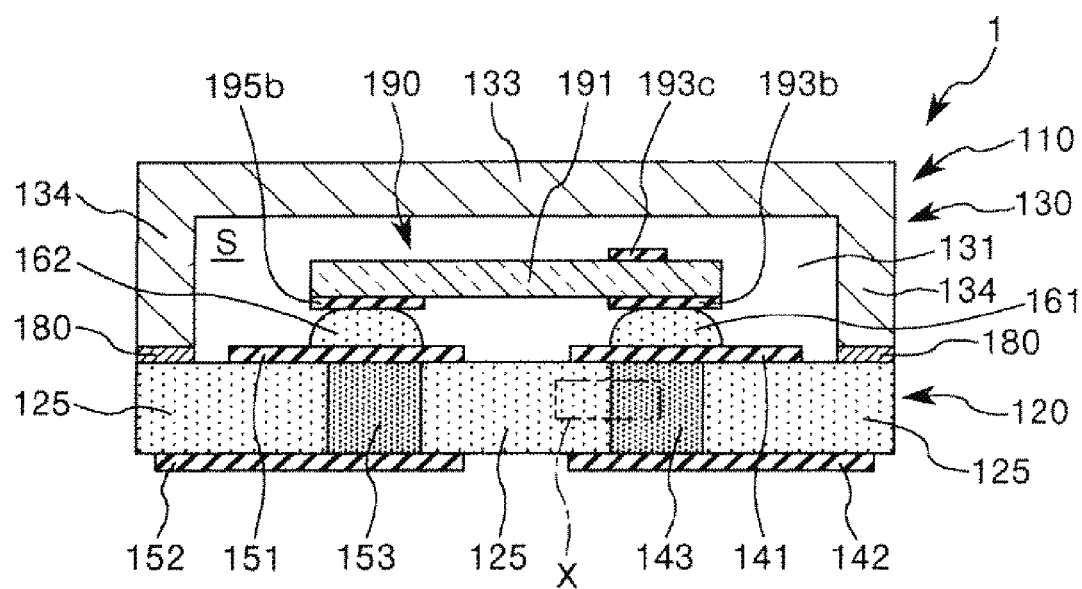
FIG. 2 is a cross-sectional view taken along the line A-A in FIG. 1.
Figure 3A:
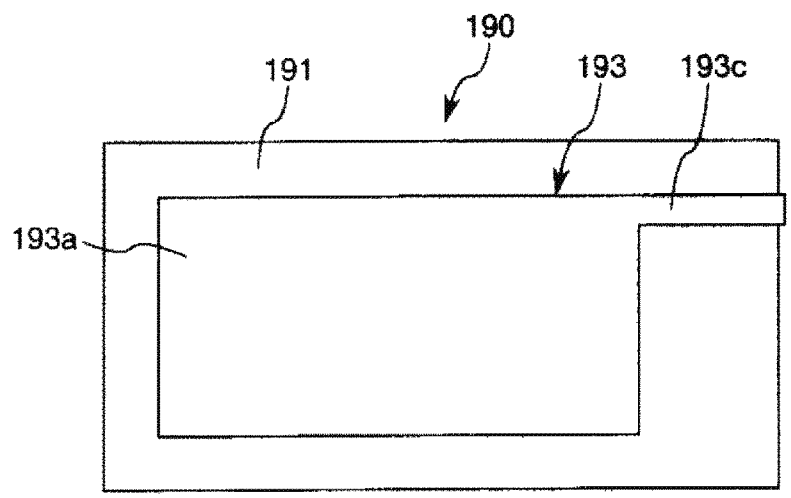
FIGS. 3A and 3B are plan views of a vibrating reed included in the vibrator shown in FIG. 1.
Figure 3B:
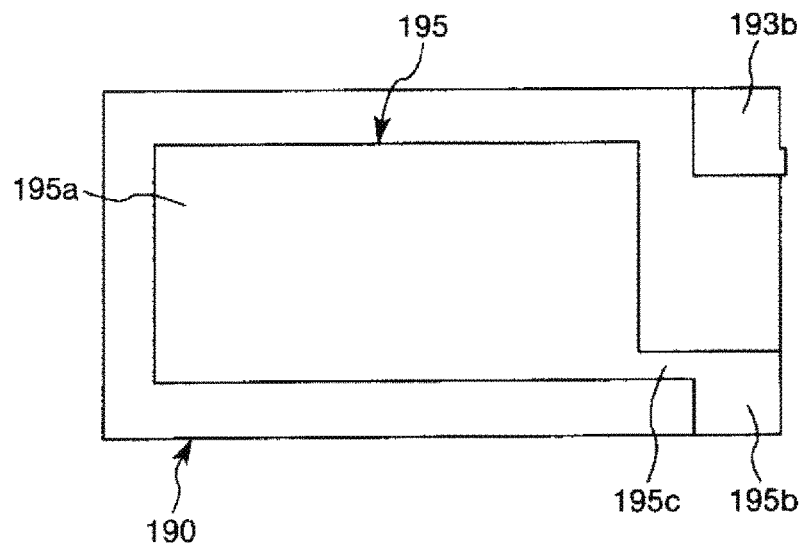

FIG. 1 is a plan view showing a first embodiment of the vibrator according to the invention, FIG. 2 is a cross-sectional view taken along the line A-A in FIG. 1, and FIGS. 3A and 3B are plan views of a vibrating reed included in the vibrator shown in FIG. 1. Hereinafter, a description will be given on the assumption that an upper side and a lower side in FIG. 2 are "upper" and "lower", respectively.

As shown in FIGS. 1 and 2, a vibrator 1 includes a package 110 and a vibrating reed 190 housed in the package 110. In FIG. 1, for the sake of convenience of explanation, the vibrator is illustrated by cutting away a portion of the package 110 so as to expose the inside.

Vibrating Reed

As shown in FIGS. 3A and 3B, the vibrating reed 190 includes a piezoelectric substrate (vibrating substrate) 191 having a rectangular plate shape when seen in a plan view and a pair of electrode layers 193 and 195, each having electrical conductivity and formed on the surface of the piezoelectric substrate 191. FIG. 3A is a plan view when seeing the upper surface of the vibrating reed 190 from the top, and FIG. 3B is a perspective view (plan view) when seeing the lower surface of the vibrating reed 190 from the top.

The piezoelectric substrate 191 is a quartz crystal blank plate that mainly performs thickness shear vibration.

In this embodiment, a quartz crystal blank plate cut out at a cut angle called an AT-cut is used as the piezoelectric substrate 191. The "AT-cut" refers to cut-out performed so as to have a principal surface (principal surface including an X-axis and a Z'-axis) which is obtained by rotating a plane (Y-plane) including an X-axis and a Z-axis, which are crystal axes of a quartz crystal, counterclockwise about the X-axis from the Z-axis by about 35° 15' degrees.

In addition, the longitudinal direction of the piezoelectric substrate 191 coincides with the X-axis which is a crystal axis of a quartz crystal.

The electrode layer 193 includes an excitation electrode 193a formed on the upper surface of the piezoelectric substrate 191, a bonding pad 193b formed on the lower surface of the piezoelectric substrate 191, and a wiring 193c that electrically connects the excitation electrode 193a to the bonding pad 193b.

On the other hand, the electrode layer 195 includes an excitation electrode 195a formed on the lower surface of the piezoelectric substrate 191, a bonding pad 195b formed on the lower surface of the piezoelectric substrate 191, and a wiring 195c that electrically connects the excitation electrode 195a to the bonding pad 195b.

The excitation electrode 193a and the excitation electrode 195a are provided so as to face each other through the piezoelectric substrate 191 and have substantially the same shape. That is, when the piezoelectric substrate 191 is seen in a plan view, the excitation electrode 193a and the excitation electrode 195a are located so as to overlap each other and are formed so that the outlines thereof substantially coincide with each other.

In addition, the bonding pads 193b and 195b are formed spaced apart from each other at end portions on the right side in FIGS. 3A and 3B on the lower surface of the piezoelectric substrate 191.

Meanwhile, the AT-cut quartz crystal blank plate has been described above as an example. However, the cut angle is not particularly limited, and a Z-cut, a BT-cut, or the like may be performed. In addition, the shape of the piezoelectric substrate 191 is not particularly limited, and may be a two-legged tuning fork shape, an H-shaped tuning fork shape, a three-legged tuning fork shape, a comb tooth shape, an orthogonal shape, a rectangular column shape, or the like.

In addition, the constituent material of the piezoelectric substrate 191 is not limited to quartz crystal, and may be another piezoelectric material, silicon, or the like.

Further, the vibrator 1 may be used not only as a timing source, but also as a sensor that detects a physical quantity such as pressure, acceleration, or angular velocity.

Package

As shown in FIGS. 1 and 2, the package 110 includes a plate-shaped base 120 and a lid 130 having a concave portion 131 which opens downward. In such a package 110, the concave portion 131 is closed by the base 120, and therefore, a space inside the concave portion 131 defined by this is used as a housing space S that houses the above-mentioned vibrating reed 190. Incidentally, in FIG. 1, the vibrator is illustrated by cutting away a portion of the lid 130.

The base 120 includes electrical through wirings 143 and 153 passing therethrough in the thickness direction and an insulating region 125 provided around the electrical through wirings 143 and 153. The base 120 is an embodiment of the electrical wiring member according to the invention.

In addition, a pair of connection electrodes 141 and 151 are provided on the upper surface of the base 120. On the other hand, a pair of external mounting electrodes 142 and 152 are formed on the lower surface of the base 120.

As described above, the base 120 is provided with the electrical through wirings 143 and 153. Here, the connection electrode 141 and the external mounting electrode 142 are electrically connected to each other through the electrical through wiring 143, and the connection electrode 151 and the external mounting electrode 152 are electrically connected to each other through the electrical through wiring 153.

The constituent material of the connection electrodes 141 and 151 and the external mounting electrodes 142 and 152 is not particularly limited. Examples of the constituent material include simple substances of metal elements such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), and zirconium (Zr), and alloys and complexes including these metal elements.

The electrical through wirings 143 and 153 and the insulating region 125 will be described in detail later.

In addition, an outer peripheral portion of the upper surface of the base 120 is provided with a frame-shaped metalized layer (not shown). The metalized layer is used for increasing the adhesiveness between the base 120 and the below-mentioned brazing material 180. Due to this, it is possible to increase the bonding strength between the base 120 and the lid 130 by the brazing material 180.

The constituent material of the metalized layer is not particularly limited as long as it is a material capable of increasing the adhesiveness with the brazing material 180. Examples of the constituent material include simple substances of metal elements such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), and zirconium (Zr), and alloys and compounds including these metal elements.

The lid 130 includes a plate-shaped base portion 133 and a frame-shaped side wall 134 which is provided on the lower surface of the base portion 133, and thus, the concave portion 131 described above is formed. Such a lid 130 is formed by processing, for example, a flat metal plate into a box shape.

The constituent material of the lid 130 is not particularly limited, and may be, for example, a ceramic material or a glass material. However, an alloy such as an Fe—Ni—Co based alloy (such as Kovar) or an Fe—Ni based alloy (such as 42 alloy) is preferably used.

In addition, a frame-shaped metalized layer (not shown) is provided also on the lower surface of the side wall 134 of the lid 130 as needed. Also this metalized layer is used for increasing the adhesiveness between the lid 130 and the below-mentioned brazing material 180. Examples of the constituent material of the metalized layer include the metal materials as described above as the constituent material of the connection electrodes 141 and 151 and the like.

A method of bonding the lid 130 to the base 120 is not particularly limited, and examples of the method include a method of allowing the brazing material 180 to penetrate between the lid 130 and the base 120 by irradiating a peripheral portion of the lid 130 with a laser in a state where the lid 130 is placed on the base 120 so as to heat and melt the brazing material 180.

The brazing material 180 is not particularly limited, and for example, gold solder, silver solder, or the like can be used, but silver solder is preferably used. In addition, the melting point of the brazing material 180 is not particularly limited, but is preferably, for example, about 800° C. or higher and 1000° C. or lower.

In the housing space S of such a package 110, the above-mentioned vibrating reed 190 is housed. The vibrating reed 190 housed in the housing space S is cantilevered by the base 120 through a pair of electrically conductive adhesives 161 and 162.

The electrically conductive adhesive 161 is provided so as to come into contact with the connection electrode 141 and the bonding pad 193b, thereby electrically connecting the connection electrode 141 to the bonding pad 193b. Similarly, the electrically conductive adhesive 162 is provided so as to come into contact with the connection electrode 151 and the bonding pad 195b, thereby electrically connecting the connection electrode 151 to the bonding pad 195b. That is, the electrically conductive adhesives 161 and 162 function as a part of the electrical wiring which is formed in the package 110.

Each of the electrically conductive adhesives 161 and 162 can also be replaced with an electrically conductive metal material. The electrically conductive metal material is not particularly limited, but examples thereof include the metal materials as described above as the constituent material of the connection electrodes 141 and 151 and the like.

In addition, the electrically conductive adhesives 161 and 162 can also be replaced with, for example, a bonding wire or the like.

Here, the electrical through wirings 143 and 153 and the insulating region 125 will be described in detail. The configurations of the electrical through wiring 143 and the electrical through wiring 153 are the same as each other, and thus, only the electrical through wiring 143 will be described below and the description of the electrical through wiring 153 will be omitted.

Figure 4:
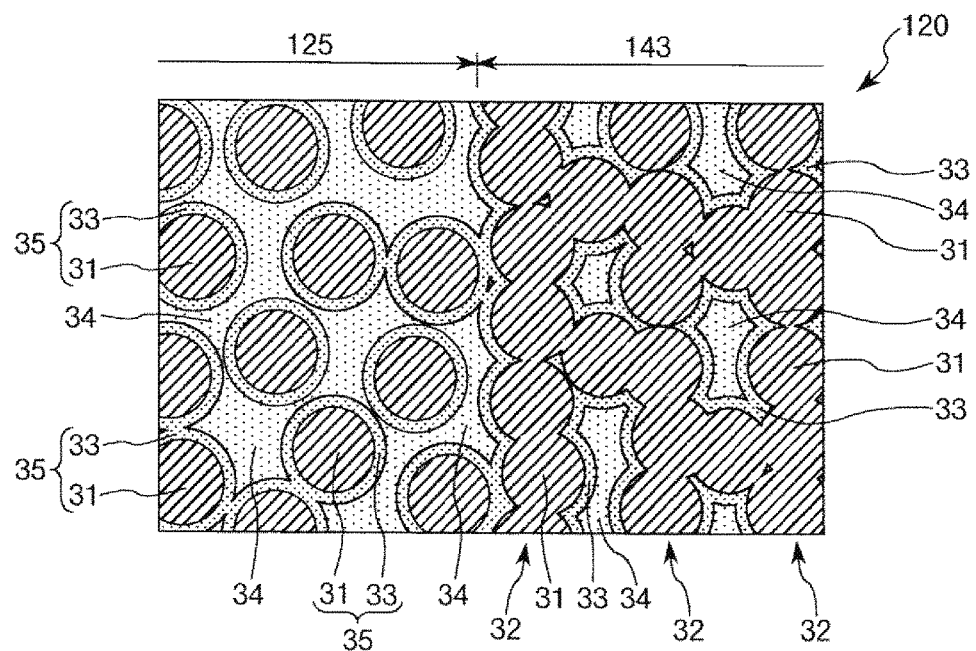
FIG. 4 is an enlarged view of a portion X of a base (an embodiment of an electrical wiring member according to the invention) which is included in the vibrator shown in FIG. 2.
Figure 5:
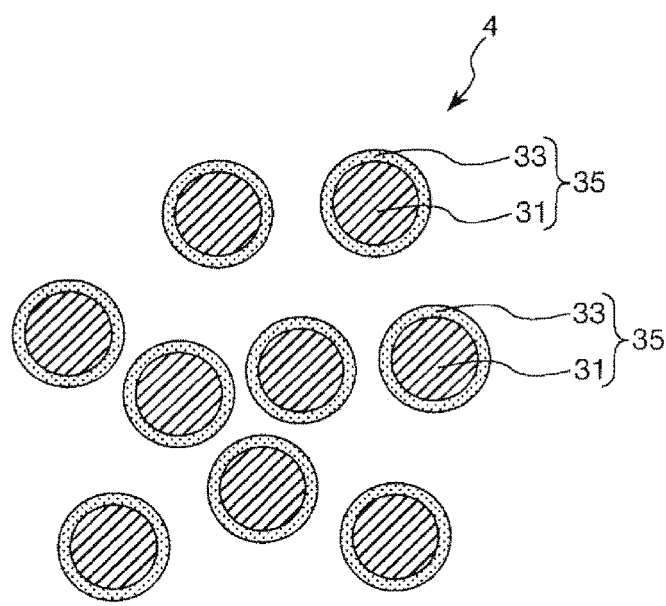
FIG. 5 is a cross-sectional view for illustrating a method for producing the vibrator shown in FIG. 1 which includes an embodiment of an electrical wiring member production method according to the invention.

FIG. 4 is an enlarged view of a portion X of a base (an embodiment of the electrical wiring member according to the invention) which is included in the vibrator shown in FIG. 2.

The portion X in FIG. 2 is set across the electrical through wiring 143 and the insulating region 125 which is adjacent thereto. Here, as shown in FIG. 4, the electrical through wiring 143 includes a particle-bonded body 32 formed by bonding the metal particles 31 to each other, a surface insulating layer 33 provided so as to cover (be located on) the surface of the particle-bonded body 32, and an interparticle insulating portion 34 provided so as to fill a gap between the particle-bonded body 32 and the surface insulating layer 33.

As shown in FIG. 4, in the electrical through wiring 143, the particle-bonded body 32 formed by bonding the metal particles 31 having electrical conductivity to each other in the form of a three-dimensional network is constructed. Due to this, the electrical through wiring 143 has substantially uniform electrical conductivity as a whole and functions as an electrical wiring which passes through the base 120 in the thickness direction.

On the other hand, the insulating region 125 includes metal particles with an insulating layer 35, each of which is constituted by the metal particle 31 and the surface insulating layer 33 provided so as to cover the surface of the metal particle. The interparticle insulating portion 34 is provided between the metal particles with an insulating layer 35. The metal particles with an insulating layer 35 are fixed to each other by the interparticle insulating portion 34, and thus, the mechanical strength of the insulating region 125 is ensured. Such an insulating region 125 functions as an insulator that insulates the electrical through wiring 143 and the electrical through wiring 153 from each other.

The electrical through wiring 143 described above is a portion which is formed by irradiating the same structure as the insulating region 125 with an energy beam, thereby bonding the metal particles 31 to each other in the structure. In other words, the region of the electrical through wiring 143 before being irradiated with an energy beam has the same configuration as the insulating region 125, and by irradiating this region with an energy beam, a desired region can be converted to the electrical through wiring 143. In addition, the insulating region 125 is constituted by a powder-compacted body formed by press-molding a mixed powder containing the metal particles with an insulating layer 35. Therefore, by irradiating such a powder-compacted body with an energy beam, the electrical through wiring 143 and the insulating region 125 are obtained.

The metal particle 31 is a particle of a metal material having electrical conductivity. Examples of the constituent material of the metal particle 31 include simple substances of metal elements such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), and zirconium (Zr), and alloys and complexes including these metal elements.

The content of the metal particles 31 in the insulating region 125 is set to a ratio capable of converting the insulating region to the electrical through wiring 143 by irradiation with an energy beam and also capable of ensuring sufficient shape retention by the interparticle insulating portion 34. For example, the content is set to preferably 40 mass % or more and 99.5 mass % or less, more preferably 50 mass % or more and 99 mass % or less. According to this, sufficient insulating properties are ensured in the insulating region 125, and on the other hand, when the insulating region 125 is irradiated with an energy beam, sufficient electrical conductivity is exhibited.

In addition, the Vickers hardness of the metal particle 31 is preferably 30 or more and 500 or less, more preferably 50 or more and 400 or less. When the Vickers hardness of the metal particle 31 is within the above range, the metal particles 31 can be moderately deformed by pushing each other when the powder-compacted body is formed as described above. Due to this, the filling factor of the powder-compacted body is increased, and the adhesiveness between the metal particles with an insulating layer 35 is also increased without damaging the surface insulating layer 33 accompanying the deformation of the metal particle 31, and thus, the shape retention as a molded body is also increased. As a result, the mechanical strength of the base 120 (electrical wiring member) can be increased and also the metal particles 31 can be easily bonded to each other by the irradiation with an energy beam, and thus, it is possible to increase the electrical conductivity of the electrical through wiring 143.

The Vickers hardness of such a metal particle 31 is measured in accordance with the test method specified in JIS Z 2244.

The particle-bonded body 32 is formed by bonding the metal particles 31 to each other. The bonding between the metal particles 31 is performed by sintering based on the irradiation with an energy beam. In the sintering, mutual movement of materials occurs between the metal particles 31, and the metal particles 31 are finally bonded to each other in the form of a three-dimensional network, thereby forming the particle-bonded body 32.

On the other hand, in the bonding between the metal particles 31, the surface insulating layer 33 covering the metal particle 31 is pushed aside as the materials constituting the metal particle 31 move, and thus is distributed so as to cover the particle-bonded body 32. In addition, the surface insulating layer 33 partially remains inside the particle-bonded body 32.

Further, the interparticle insulating portion 34 is pushed aside as the materials constituting the metal particle 31 move, and some moves outside the particle-bonded body 32, but some remains inside the particle-bonded body 32.

As a result, as shown in FIG. 4, the electrical through wiring 143 including the particle-bonded body 32, the surface insulating layer 33, and the interparticle insulating portion 34 is obtained.

The electrical through wiring 143 obtained in this manner has electrical conductivity which is comparable or equivalent to that of a bulk body of the constituent material of the metal particle 31. On the other hand, the insulating region 125 that insulates the periphery thereof has sufficient insulating properties. According to this, the vibrator 1 achieves both excellent frequency characteristics and low power consumption.

The surface insulating layer 33 may be provided so as to cover (be located on) at least a portion of the surface of the metal particle 31, but is preferably provided so as to cover the entire surface of the metal particle 31. By providing such a surface insulating layer 33, the metal particle with an insulating layer 35 is obtained. In the metal particle with an insulating layer 35, the surface insulating layer 33 is interposed between the metal particles 31 having electrical conductivity, and thus, the metal particles with an insulating layer 35 are reliably insulated from each other.

Examples of the constituent material of the surface insulating layer 33 include various types of glass materials containing, as a main component, $B_2O_3$, $SiO2$, $Al2O3$, $Bi2O3$, $ZnO$, $SnO$, $P2O5$, or the like. In addition to these materials, the glass material may contain a secondary component such as PbO, Li2O, Na2O, K2O, MgO, CaO, SrO, BaO, Gd2O3, Y2O3, La2O3, or Yb2O3.

More specifically, examples of the constituent material of the surface insulating layer 33 include various types of glass materials such as sodium silicate glass, soda lime glass, borosilicate glass, lead glass, aluminosilicate glass, borate glass, phosphate glass, sulfate glass, and vanadate glass.

The glass materials as described above have excellent chemical stability and insulating properties as compared with an organic material, and therefore, the surface insulating layer 33 capable of maintaining high insulating properties over a long period of time is obtained.

Among such glass materials, a glass material having a softening point of 650° C. or lower is preferably used, a glass material having a softening point of 100° C. or higher and 600° C. or lower is more preferably used, and a glass material having a softening point of 300° C. or higher and 500° C. or lower is further more preferably used. By selecting the glass material having a softening point within the above range, the glass material melted when being irradiated with an energy beam has sufficient fluidity, and therefore, the metal particles 31 are easily bonded to each other (the glass material is easily pushed aside), and thus, the electrical through wiring 143 having high electrical conductivity is obtained.

The softening point of the glass material is measured by the measurement method of a softening point specified in JIS R 3103-1.

Examples of the glass material constituting the surface insulating layer 33 particularly include SnO—$P_2O5$-MgO, SnO—P2O5, Bi2O3-B2O3-ZnO, Bi2O3-ZnO—B2O3, SiO2-Al2O3-B2O3, SiO2-B2O3-Al2O3, SiO2-B2O3-ZnO, Bi2O3-B2O3, and ZnO—B2O3-SiO2.

In addition, a non-electrically conductive inorganic material such as a ceramic material or a silicon material may be added to the glass material constituting the surface insulating layer 33 to such an extent that the characteristics of the glass material are not impaired. In this case, the addition amount of the material is set to, for example, about 10 mass % or less.

The average thickness of the surface insulating layer 33 is not particularly limited, but is preferably about 0.1% or more and 5% or less, more preferably about 0.3% or more and 3% or less of the average particle diameter of the metal particle 31. By setting the thickness of the surface insulating layer 33 with respect to the average particle diameter of the metal particle 31 within the above range, the irregularities of the surface of the metal particle 31 can be sufficiently absorbed by the surface insulating layer 33. According to this, the metal particle with an insulating layer 35 can ensure sufficient insulating properties even if the metal particles with an insulating layer come into contact with each other.

More specifically, the average thickness of the surface insulating layer 33 is preferably 50 nm or more and 3000 nm or less, more preferably 100 nm or more and 2000 nm or less. By setting the average thickness of the surface insulating layer 33 within the above range, even if the metal particles with an insulating layer 35 come into contact with each other in the insulating region 125, electrical conduction between the metal particles 31 can be prevented, and thus, the decrease in the insulating properties of the insulating region 125 can be prevented.

When the average thickness of the surface insulating layer 33 is less than the above lower limit, the metal particle 31 may pass through the surface insulating layer 33 and electrical conduction between the metal particles 31 may undesirably occur when the insulating region 125 is pressurized, or the like depending on the particle diameter or the constituent material of the metal particle 31. On the other hand, if the average thickness of the surface insulating layer 33 exceeds the above upper limit, when the metal particles 31 are bonded to each other, the probability that the surface insulating layer 33 inhibits the bonding is increased depending on the particle diameter or the constituent material of the metal particle 31. Due to this, a larger amount of energy for sintering is needed, and so on, and the efficiency of the formation of the electrical through wiring 143 may be undesirably decreased.

The average thickness of the surface insulating layer 33 is the average of the thickness of the surface insulating layer 33 at ten points set at substantially equal intervals obtained by observing the cross section of one metal particle with an insulating layer 35 using a microscope. In the case where the particle diameter and the using amount of the metal particles 31 used at the time of producing the metal particles with an insulating layer 35 and the using amount of the surface insulating layer 33 are known, it is also possible to derive the average thickness of the surface insulating layer 33 by calculation from the information of these factors.

The interparticle insulating portion 34 is interposed between the metal particles with an insulating layer 35 in the insulating region 125 and also partially remains inside the electrical through wiring 143. By fixing the metal particles with an insulating layer 35 in the insulating region 125 by such an interparticle insulating portion 34, the mechanical strength of the insulating region 125 is ensured. According to this, the insulating region 125 has a mechanical strength required as the base 120.

The constituent material of the interparticle insulating portion 34 contains a resin material, and may contain other material as needed, for example, an inorganic insulating material such as a glass material, a ceramic material, or a silicon material.

Examples of the resin material to be contained in the interparticle insulating portion 34 include a silicone-based resin, an epoxy-based resin, a phenolic resin, a polyamide-based resin, a polyimide-based resin, a silicate-based resin, a urethane-based resin, an acrylic resin, a polyester-based resin, a polyolefin-based resin, a fluororesin, a liquid crystal polymer resin, a polyphenylene sulfide-based resin, a wax, a higher fatty acid, an alcohol, a fatty acid metal, a nonionic surfactant, and a silicone-based lubricant.

Examples of the wax among these include natural waxes including vegetable waxes such as candelilla wax, carnauba wax, rice wax, Japan wax, and jojoba oil, animal waxes such as bees wax, lanolin, and spermaceti, mineral waxes such as montan wax, ozokerite, and ceresin, petroleum-based waxes such as paraffin wax, microcrystalline wax, and petrolatum, and the like, and synthetic waxes including synthetic hydrocarbons such as polyethylene wax, modified waxes such as a montan wax derivative, a paraffin wax derivative, and a microcrystalline wax derivative, hydrogenated waxes such as hardened castor oil and a hardened castor oil derivative, fatty acids such as 12-hydroxystearic acid, acid amides such as stearic acid amide, esters such as phthalimide anhydride, and the like.

Examples of the higher fatty acid include stearic acid, oleic acid, and linoleic acid, and particularly, a saturated fatty acid such as lauric acid, myristic acid, palmitic acid, stearic acid, or arachidic acid is preferably used.

Examples of the alcohol include a polyhydric alcohol, polyglycol, and polyglycerol, and particularly, cetyl alcohol, stearyl alcohol, oleyl alcohol, mannitol, or the like is preferably used.

Examples of the fatty acid metal include compounds composed of a higher fatty acid such as lauric acid, stearic acid, succinic acid, stearyl lactic acid, lactic acid, phthalic acid, benzoic acid, hydroxystearic acid, ricinoleic acid, naphthenic acid, oleic acid, palmitic acid, or erucic acid and a metal such as Li, Na, Mg, Ca, Sr, Ba, Zn, Cd, Al, Sn, Pb, or Cd, and particularly, magnesium stearate, calcium stearate, sodium stearate, zinc stearate, calcium oleate, zinc oleate, magnesium oleate, or the like is preferably used.

Examples of the nonionic surfactant-based lubricant include Electrostripper TS-2 and Electrostripper TS-3 (both are manufactured by Kao Corporation).

Examples of the silicone-based lubricant include dimethylpolysiloxane and a modified product thereof, carboxyl-modified silicone, α-methylstyrene-modified silicone, α-olefin-modified silicone, polyether-modified silicone, fluorine-modified silicone, specially modified hydrophilic silicone, olefin polyether-modified silicone, epoxy-modified silicone, amino-modified silicone, amide-modified silicone, and alcohol-modified silicone.

The interparticle insulating port ion 34 contains one or two or more types among the above-mentioned resin materials.

Among these, as the resin material to be contained in the interparticle insulating portion 34, an epoxy-based resin is preferably used. The epoxy-based resin has high insulating properties and also favorable mechanical characteristics, and therefore is preferred as the resin material to be contained in the interparticle insulating portion 34.

In the case where the interparticle insulating portion 34 contains a glass material, the composition of the glass material constituting the interparticle insulating portion 34 and the composition of the glass material constituting the surface insulating layer 33 may be different, but are preferably the same. When the composition of the glass material constituting the interparticle insulating portion 34 and the composition of the glass material constituting the surface insulating layer 33 are the same, the surface insulating layer 33 and the interparticle insulating portion 34 are softened at the same softening point and can be mixed with each other at the time of bonding the metal particles 31 to each other by sintering, and therefore, the bonding between the metal particles 31 is not likely to be inhibited by the glass material. Due to this, the metal particles 31 are smoothly and evenly bonded to each other, and thus, the electrical through wiring 143 with high electrical conductivity can be formed.

In addition, when irradiation with an energy beam is performed, the boundary (threshold value) between an energy amount that reaches the bonding between the metal particles 31 and an energy amount that does not reach the bonding is likely to be clear. Due to this, when a region where the electrical through wiring 143 is to be formed is irradiated with an energy beam, the boundary between the electrical through wiring 143 and the insulating region 125 is likely to be clear. Therefore, the electrical through wiring 143 with high definition when seen in a plan view can be formed.

In addition, since the insulating region 125 has insulating properties but contains the metal particles 31, the insulating region has high thermal conductivity derived from the metal material. Therefore, the base 120 has high thermal conductivity. Even when an element serving as a heat source is mounted on such a base 120, the base 120 has excellent heat dissipation, and therefore contributes to the suppression of an increase in the temperature of the element, and thus, long life and high performance of the element can be achieved.

In the case where the interparticle insulating portion 34 contains the above-mentioned inorganic insulating material, the addition amount thereof is set to, for example, about 1 mass % or more and 50 mass % or less of the amount of the interparticle insulating portion 34.

Further, it is preferred that the thermal expansion coefficient of such a glass material is $2 \times 10^{-6}$ [/° C.] or more and $15 \times 10^{-6}$ [/° C.] or less, and the thermal expansion coefficient of the constituent material of the metal particle 31 is preferably $4 \times 10^{-6}$ [/° C.] or more and $20 \times 10^{-6}$ [/° C.] or less. By selecting each of the glass material and the metal material having a thermal expansion coefficient within the above range, even when the temperature of the base 120 changes, a gap is less likely to be formed between the metal particle 31 and the surface insulating layer 33 or the interparticle insulating portion 34. As a result, a decrease in the airtightness of the package 110 due to the temperature change can be suppressed.

Incidentally, this thermal expansion coefficient is obtained at a temperature in the range from 30° C. to 300° C.

Hereinabove, the base 120 to which the embodiment of the electrical wiring member according to the invention is applied and the package 110 including the base have been described, however, the application of the embodiment of the electrical wiring member according to the invention is not limited thereto, and the embodiment can also be applied to, for example, an electrical circuit board, an interposer substrate, or the like for mounting an active element such as an IC or an LSI or a passive element such as a resistor, a capacitor, or a coil.

In addition, the base 120 according to this embodiment has airtightness in the thickness direction when the filling factor of the metal particles 31 is increased. That is, since the interparticle insulating portion 34 is filled between the metal particles with an insulating layer 35, the gas permeability of the base 120 is sufficiently decreased.

The leakage amount in the thickness direction of the base 120 is preferably $1 \times 10^{-4}$ Pa·m³/s or less, more preferably $1 \times 10^{-8}$ Pa·m³/s or less. The base 120 exhibiting such a leakage amount has sufficient airtightness as the base to be used for the package 110 of the vibrator 1.

The leakage amount is measured by a leakage detector (vacuum method). At this time, helium gas is used as the measurement gas.

The shape of the electrical wiring member according to the invention is not limited to a plate shape, and may be an arbitrary three-dimensional shape having a surface which can be irradiated with an energy beam.

Vibrator Production Method and Electrical Wiring Member Production Method

Next, a method for producing a vibrator according to the invention and an embodiment of an electrical wiring member production method according to the invention included therein will be described.

FIGS. 5 to 9 are cross-sectional views for illustrating a method for producing the vibrator shown in FIG. 1 which includes an embodiment of an electrical wiring member production method according to the invention.

The method for producing the vibrator shown in FIGS. 5 to 9 includes [1] a step of molding a powder 4 containing metal particles with an insulating layer 35 while pressurizing the powder 4, thereby obtaining a powder-compacted layer 41, and [2] a step of irradiating the powder-compacted layer 41 with an energy beam, thereby forming electrical through wirings 143 and 153 in the irradiated region. Hereinafter, the respective steps will be sequentially described.

[1] Molding Step

[1-1]

First, an aggregate of metal particles with an insulating layer 35 (a powder of metal particles with an insulating layer 35) is mixed with an insulating material for forming an interparticle insulating portion 34, whereby a powder 4 (composition) is prepared.

The metal particle with an insulating layer 35 is formed by attaching a glass material to the surface of a metal particle 31. Examples of the attaching method include wet methods such as a method of applying a liquid containing a glass powder to the metal particle 31 and a method of granulating the metal particles 31 while spraying a liquid containing a glass powder, and dry methods such as a method of attaching a glass material to the surface of the metal particle 31. Among these, a method of mechanically attaching a glass material to the surface of the metal particle 31 is preferably used. Such a method can be performed under dry conditions, and can also be performed in an inert gas as needed. Due to this, a possibility that water or the like is interposed between the metal particle 31 and a surface insulating layer 33 is decreased, and thus, degeneration or deterioration of the metal particles 31 can be suppressed over a long period of time. Further, since the glass material is mechanically attached to the surface of the metal particle, even if a foreign matter, an oxide coating film, or the like is adhered to the surface of the metal particle 31, the surface insulating layer 33 can be formed while removing or destroying such a material. As a result, the metal particle 31 covered with the surface insulating layer 33 has high cleanliness, and a particle-bonded body 32 formed by bonding the metal particle 31 by irradiation with an energy beam has high electrical conductivity.

Further, according to this method, also a glass material which has a high softening point and is difficult to handle can be formed into a coating film as the surface insulating layer 33. Due to this, this method is useful in that a wide variety of glass materials can be used.

Examples of the method of mechanically attaching a glass material to the surface of the metal particle 31 include a method of using an apparatus that generates a mechanical compressive action and a friction action on, for example, a mixed powder of the metal particles 31 and a glass powder. Examples of such an apparatus include various types of pulverizers such as a hammer mill, a disk mill, a roller mill, a ball mill, a planetary mill, and a jet mill, and various types of friction mixers such as an Angmill (registered trademark), a high-speed oval mixer, a Mix Muller (registered trademark), a Jacobson mill, a Mechano-Fusion (registered trademark), and a Hybridization (registered trademark). It is considered that in these apparatuses, a glass powder is pressed against the surface of the metal particle 31 so as to fuse the surfaces of the particles to each other. As a result, the metal particle with an insulating layer 35 formed by attaching a glass material to the surface of the metal particle 31 is obtained.

In the following description, a glass material to be used for forming the metal particle with an insulating layer 35 is also referred to as "first glass material" and a powder of the first glass material is also referred to as "first glass powder". In addition, a glass material which may be contained in the interparticle insulating portion 34 is also referred to as "second glass material" and a powder of the second glass material is also referred to as "second glass powder".

The average particle diameter of the metal particle 31 is not particularly limited, but is preferably about 0.5 µm or more and 30 µm or less, more preferably about 1 µm or more and 20 µm or less. By setting the average particle diameter of the metal particle 31 within the above range, both high electrical conductivity of the electrical through wiring 143 and high positional accuracy (definition) of the electrical through wiring 143 can be achieved. When the average particle diameter of the metal particle 31 is smaller than the above lower limit, the volume reduction ratio at the time of bonding the metal particles 31 may be undesirably relatively increased though it depends on the constituent material of the metal particle 31. Due to this, the positional accuracy of the electrical through wiring 143 may be undesirably decreased or a space may be undesirably easily formed therein. In addition, since the size of the metal particle 31 is too small to generate a sufficient compressive action or friction action, the efficiency of the production of the metal particle with an insulating layer 35 may be undesirably decreased. On the other hand, if the average particle diameter of the metal particle 31 is larger than the above upper limit, for example, when the electrical through wiring 143 having a narrow line width is to be formed, the line width cannot be made sufficiently small, and therefore, it may become difficult to increase the density of the electrical through wiring 143. In addition, since the size of the metal particle 31 is too large, the surface insulating layer 33 may be undesirably easily peeled off.

The average particle diameter of the metal particle 31 is obtained as a particle diameter when the accumulated amount from a small diameter side on a mass basis reaches 50% in a particle size distribution acquired by a laser diffraction particle size distribution analyzer.

In addition, in the case where the average particle diameter of the metal particle 31 is within the above range, the maximum particle diameter of the metal particle 31 is preferably 200 µm or less, more preferably 150 µm or less. By setting the maximum particle diameter of the metal particle 31 within the above range, the metal particle 31 is less likely to be separated from the surface insulating layer 33 while increasing the definition of the electrical through wiring 143, and thus, sufficient insulating properties of the insulating region 125 can be ensured.

The maximum particle diameter of the metal particle 31 is obtained as a particle diameter when the accumulated amount from a small diameter side on a mass basis reaches 99.9% in a particle size distribution acquired by a laser diffraction particle size distribution analyzer.

As the first glass powder to be used in this method, a glass powder having a larger average particle diameter than the metal particle 31 may be used, however, a glass powder having a smaller average particle diameter than the metal particle 31 is preferably used. Specifically, the average particle diameter of the first glass powder is preferably 1% or more and 60% or less, more preferably 10% or more and 50% or less of the average particle diameter of the metal particle 31. By setting the ratio of the average particle diameter of the first glass powder to the average particle diameter of the metal particle 31 within the above range, the above-mentioned compressive action and friction action are sufficiently generated on the first glass powder. Due to this, the first glass powder can be evenly and uniformly attached to the surface of the metal particle 31.

The average particle diameter of the first glass powder is obtained as a particle diameter when the accumulated amount from a small diameter side on a mass basis reaches 50% in a particle size distribution acquired by a laser diffraction particle size distribution analyzer.

In addition, the amount of the first glass powder to be used for producing the metal particle with an insulating layer 35 is appropriately set based on a relationship between the particle diameter of the metal particle 31 and the thickness of the surface insulating layer 33 in the metal particle with an insulating layer 35 to be formed.

The metal particles 31 may be produced by any method. Examples of the production method include various types of powdering methods such as an atomization method (for example, a water atomization method, a gas atomization method, a spinning water atomization method, and the like), a reduction method, a carbonyl method, and a pulverization method.

Among these, metal particles produced by an atomization method are preferably used, and metal particles produced by a water atomization method or a spinning water atomization method are more preferably used. The atomization method is a method in which a molten metal (metal melt) is caused to collide with a fluid (liquid or gas) which is sprayed at a high speed to atomize the metal melt into a fine powder and also the fine powder is cooled, whereby a metal powder is produced. By producing the metal particles 31 by such an atomization method, an extremely fine powder can be efficiently produced. Further, the shape of the particle of the obtained powder is close to a spherical shape by the action of surface tension. Due to this, a metal particle having a high filling factor at the time of molding is obtained. That is, the base 120 according to this embodiment achieves both high mechanical strength and high electrical conductivity.

The thus obtained metal particles 31 may be classified as needed. Examples of the classification method include dry classification such as sieving classification, inertial classification, and centrifugal classification, and wet classification such as sedimentation classification.

In addition, the produced metal particles with an insulating layer 35 may be granulated as needed. Examples of the granulation method include a spray drying method, a tumbling granulation method, a fluidized bed granulation method, a tumbling fluidized bed granulation method, a stirring mixing granulation method, an extrusion granulation method, a crushing granulation method, and a compressive granulation method.

On the other hand, the insulating material for forming the interparticle insulating portion 34 is prepared in the form of a powder or a granule by kneading the above-mentioned resin material, and also an inorganic insulating material, a curing agent, a curing accelerator, a filler, a flame retardant, or the like to be added as needed, cooling and solidifying the kneaded material, and then, crushing the solidified material.

The thus obtained insulating material powder and the metal particles with an insulating layer 35 are mixed, whereby the powder 4 is obtained.

In the case where the interparticle insulating portion 34 contains the second glass material, the second glass powder may be mixed in the powder 4 along with the metal particles with an insulating layer 35. The average particle diameter of the second glass powder to be mixed is not particularly limited, but is preferably smaller than that of the metal particle 31. Specifically, the average particle diameter of the second glass powder is preferably 1% or more and 60% or less, more preferably 10% or more and 50% or less of the average particle diameter of the metal particle 31. By setting the ratio of the average particle diameter of the second glass powder to the average particle diameter of the metal particle 31 within the above range, the powder-compacted layer 41 having excellent shape retention can be obtained.

The amount of the second glass powder to be mixed in the powder 4 is appropriately set according to the ratio between the amount of the metal particles with an insulating layer 35 and the amount of the interparticle insulating portion 34 in the base 120 to be formed. Specifically, when the sum of the volume of the metal particles with an insulating layer 35 and the volume of the second glass powder in the powder 4 is assumed to be 100, the volume of the second glass powder to be mixed in the powder 4 is preferably more than 0 and 65 or less, more preferably 5 or more and 50 or less, further more preferably 10 or more and 40 or less. By setting the volume of the second glass powder within the above range, the mechanical strength of the base 120 can be further increased while achieving both electrical conductivity of the electrical through wirings 143 and 153 and insulating properties of the insulating region 125.

[1-2]

Subsequently, the prepared powder 4 is molded while being pressurized. Such molding may be performed by any method, and is performed using, for example, a press-molding machine 5 as shown in FIGS. 6A and 6B.

Figure 6A:
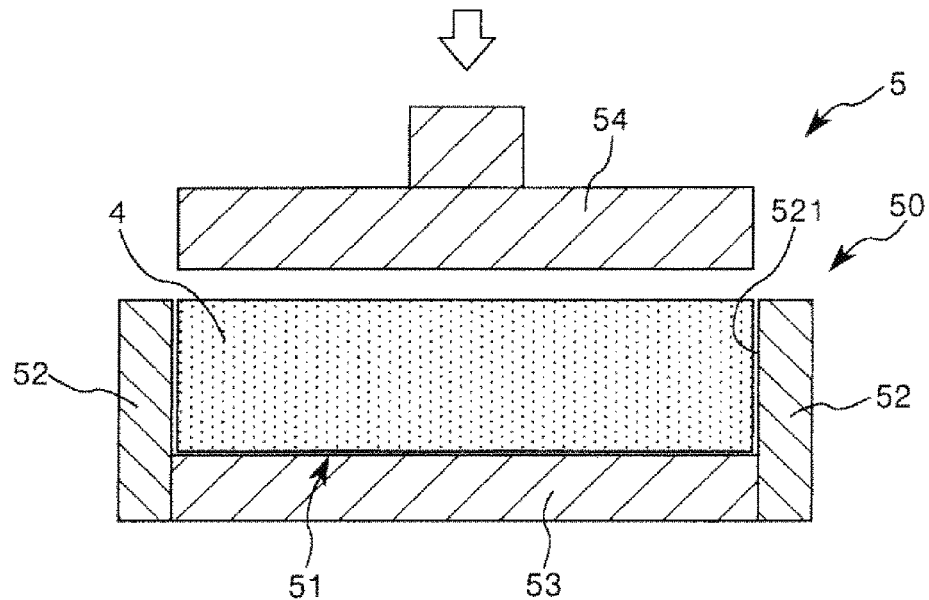
FIGS. 6A and 6B are cross-sectional views for illustrating a method for producing the vibrator shown in FIG. 1 which includes an embodiment of an electrical wiring member production method according to the invention.
Figure 6B:
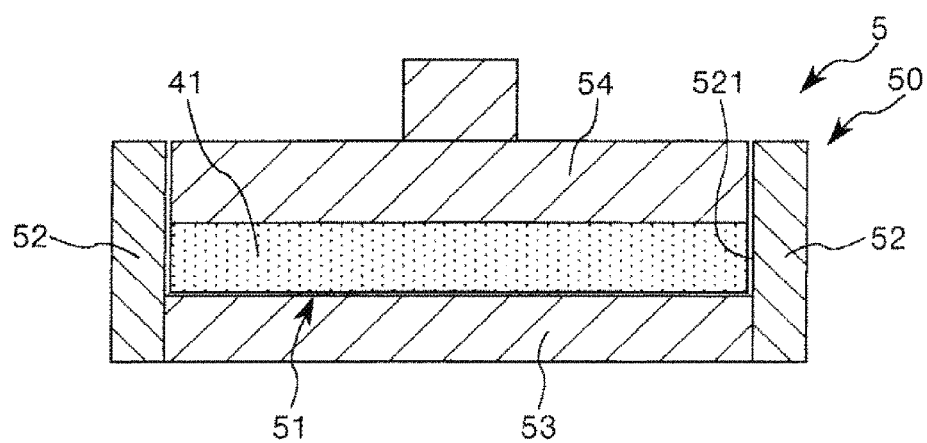

The press-molding machine 5 shown in FIGS. 6A and 6B includes a molding die 50 including a cavity 51. The molding die 50 includes a die 52 including a through hole 521 which vertically passes therethrough, a lower punch 53 which is provided on the lower side of the die 52 and is configured to be able to block the lower surface of the through hole 521, and an upper punch 54 which is provided on the opposite side to the lower punch 53 of the through hole 521 and is configured to be able to block the upper surface of the through hole 521. A space surrounded by the die 52, the lower punch 53, and the upper punch 54 is the cavity 51.

In such a press-molding machine 5, the lower punch 53 and the upper punch 54 are configured to be able to relatively move with respect to the die 52. According to this, the volume of the cavity 51 changes in accordance with the movement of the lower punch 53 and the upper punch 54, and thus, it is possible to take a mold-closing state shown in FIG. 6B where the minimum volume is reached and a mold-opening state shown in FIG. 6A where the cavity 51 is opened.

In the molding of the powder 4, first, the molding die 50 is brought into the mold-opening state, and the powder 4 is filled in the cavity 51. At this time, by appropriately setting the volume of the powder 4 filled in the cavity 51, the thickness of the base 120 to be obtained finally can be adjusted.

Figure 7A:
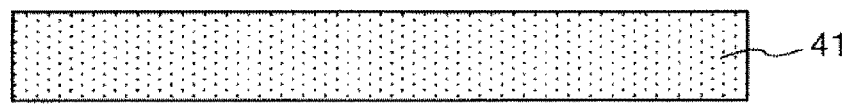
FIGS. 7A to 7C are cross-sectional views for illustrating a method for producing the vibrator shown in FIG. 1 which includes an embodiment of an electrical wiring member production method according to the invention.

Subsequently, the upper punch 54 is laid face down, and the powder 4 in the cavity 51 is molded while being pressurized. By doing this, the powder 4 is molded into a plate shape, and thus, the powder-compacted layer 41 shown in FIG. 7A is obtained. At this time, filling is performed in a state where the metal particles with an insulating layer 35 or the metal particle with an insulating layer 35 and the insulating material come into close contact with each other. Due to this, a distance between the metal particles 31 in the powder-compacted layer 41 is decreased, and when an energy beam is irradiated in the below-mentioned step, the resolution at the boundary between the irradiated region and the non-irradiated region is increased. As a result, a high-definition electrical wiring can be formed.

The molding pressure at this time is not particularly limited, but is preferably 1 MPa or more and 3000 MPa or less (0.1 t/cm$^2$ or more and 30 t/cm$^2$ or less).

In addition, the thickness of the powder-compacted layer 41 to be obtained is also not particularly limited, but is preferably 0.1 mm or more and 30 mm or less, more preferably 0.3 mm or more and 15 mm or less.

After press-molding, the obtained powder-compacted layer 41 is heated. By doing this, the resin material in the insulating material is melted, and then, by solidifying or curing the melted resin material, the metal particles with an insulating layer 35 are fixed to each other in the insulating region 125. As a result, the mechanical strength of the powder-compacted layer 41 is ensured.

At this time, the heating temperature is preferably 130° C. or higher and 180° C. or lower, and the heating time is preferably 5 minutes or more and 2 hours or less. This heating may be performed simultaneously with the molding, or may be performed both during and after molding.

In addition, the heating atmosphere is also not particularly limited, and may be an oxidizing gas atmosphere, a reducing gas atmosphere, or the like. However, in consideration of the degeneration and deterioration of the metal particles 31 and the surface insulating layer 33, the heating atmosphere is preferably an inert gas atmosphere such as a nitrogen gas atmosphere or an argon gas atmosphere, or a reduced pressure atmosphere, and in particular, the heating atmosphere is more preferably an inert gas atmosphere.

Further, the heating temperature is preferably lower than the sintering temperature of the metal particles 31. According to this, unintended bonding of the metal particles 31 in this step can be prevented, and thus, the inhibition of bonding of the metal particles 31 by the below-mentioned irradiation with an energy beam E can be prevented.

The sintering temperature of the metal particles 31 is set to be lower by 10% than the melting point of the constituent material of the metal particles 31.

The powder-compacted layer 41 obtained in this manner exhibits electrical conductivity by the below-mentioned irradiation with an energy beam and thus is capable of forming an electrical wiring, and corresponds to an embodiment of an electrical wiring member forming material according to the invention. In other words, the powder-compacted layer 41 has an electrical wiring forming ability so as to be able to form an electrical wiring having a desired pattern only by irradiating an arbitrary region with an energy beam.

The shape of the powder-compacted layer 41 is not limited to the above-mentioned plate shape, and may be any shape including a three-dimensional shape such as a block shape or a spherical shape.

[2] Wiring Forming Step

[2-1]

Figure 7B:
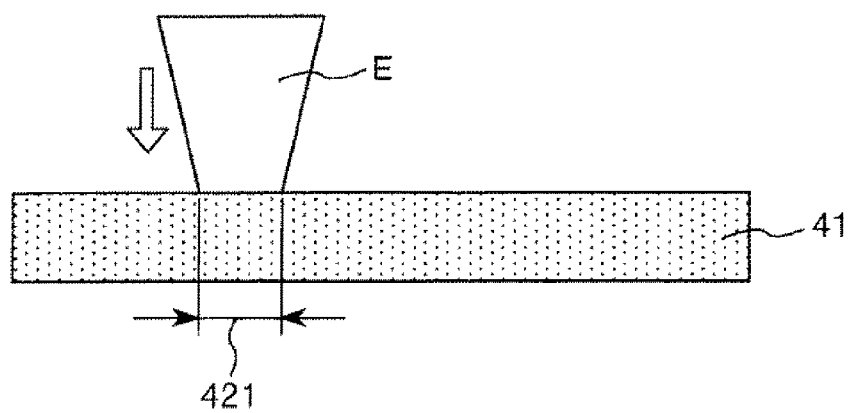
Figure 7C:
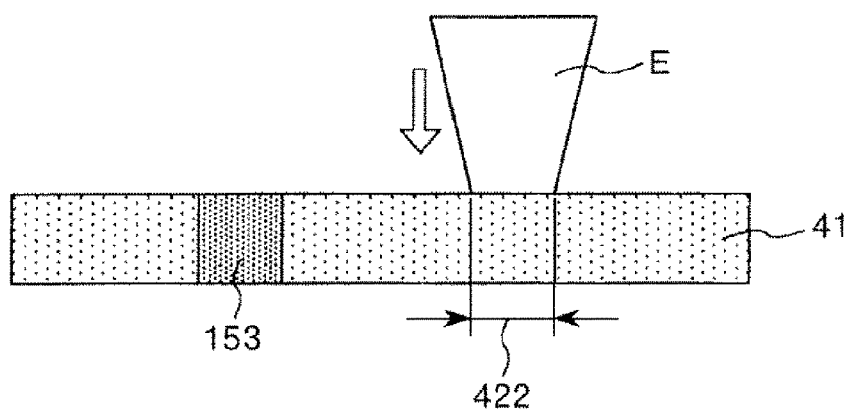

Subsequently, a region 421 where the electrical through wiring 153 is to be formed in the obtained powder-compacted layer 41 is irradiated with an energy beam E (see FIG. 7B). By doing this, the metal particles 31 which are present in the region 421 of the powder-compacted layer 41 are bonded to each other, and thus, a particle-bonded body 32 is formed. As a result, electrical conductivity is imparted to the region 421, and thus, the electrical through wiring 153 shown in FIG. 7C is formed.

Figure 8A:
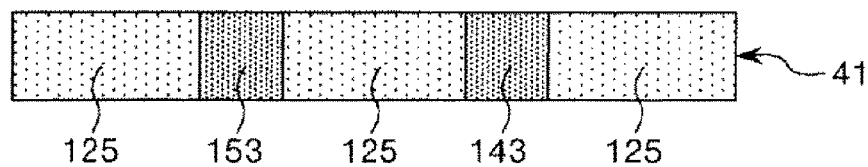
FIGS. 8A to 8C are cross-sectional views for illustrating a method for producing the vibrator shown in FIG. 1 which includes an embodiment of an electrical wiring member production method according to the invention.

Subsequently, a region 422 where the electrical through wiring 143 is to be formed is irradiated with an energy beam E (see FIG. 7C). By doing this, electrical conductivity is imparted also to the region 422, and thus, the electrical through wiring 143 shown in FIG. 8A is formed.

Examples of the energy beam E include a lamp light, a laser, a radiation, an electron beam, and an ion beam, and particularly, a laser is preferably used. Since the laser has high directivity, it is possible to selectively apply energy to a desired region without using a mask or the like. Due to this, the efficiency of the production of the base 120 can be further increased. In the case where an energy beam which is other than a laser and has low directivity is used, irradiation may be performed using a mask.

The wavelength of the energy beam E is not particularly limited, but is preferably about 100 nm or more and 1300 nm or less, more preferably about 300 nm or more and 1200 nm or less. By setting the wavelength of the energy beam E within the above range, the energy absorptivity of the powder-compacted layer 41 is increased, and thus, the electrical through wirings 143 and 153 can be efficiently formed.

The irradiation time of the energy beam E varies depending on the type, wavelength, and intensity of the energy beam E and is appropriately set based on these factors.

When the energy beam E is scanned, the scanning speed thereof is, for example, 1 mm/sec or more and 300 mm/sec or less.

In addition, when the energy beam E is a laser, as the type of the laser, for example, an excimer laser, a carbon dioxide laser, a YAG laser, a $YVO_4$ laser, or the like is used.

In this manner, the base 120 having the electrical through wirings 143 and 153 and the insulating region 125 formed therein is obtained. Since each of the electrical through wirings 143 and 153 and the insulating region 125 is formed by modifying a portion of one powder-compacted layer 41, it can be said that the wirings and the region are integrally formed. Due to this, the insulating region 125 and each of the electrical through wirings 143 and 153 are rigidly connected to each other, and thus, the mechanical strength at the boundary between the insulating region 125 and each of the electrical through wirings 143 and 153 is sufficiently increased, and thus, the occurrence of a problem such as the peeling-off of the electrical through wirings 143 and 153 can be suppressed. Therefore, it is possible to produce a vibrator 1 having high reliability. In addition, the electrical through wirings 143 and 153 in the base 120 are easily formed at a narrow pitch, and thus, it is possible to achieve the miniaturization and cost reduction of the vibrator 1.

In the following steps, in the base 120, the connection electrodes 141 and 151 and the external mounting electrodes 142 and 152 are further provided.

[2-2]

Figure 8B:
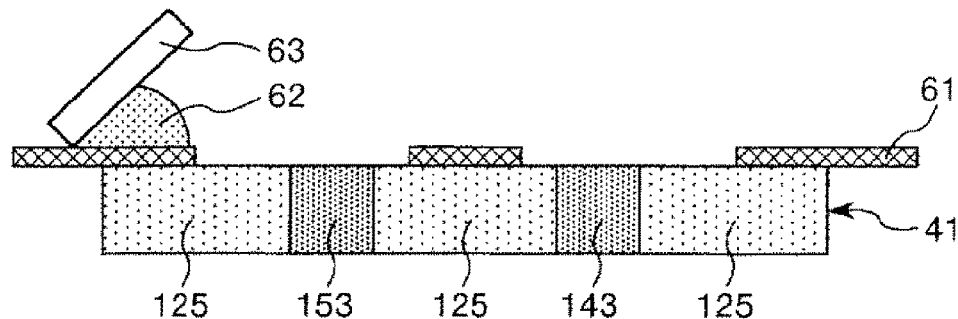

First, as shown in FIG. 8B, a mask 61 is disposed on the upper surface of the powder-compacted layer 41. The mask 61 is a stencil mask having window portions corresponding to regions where the connection electrodes 141 and 151 are formed in the below-mentioned step.

Subsequently, as shown in FIG. 8B, an electrically conductive paste 62 is disposed on the mask 61, and the electrically conductive paste 62 is spread using a squeegee 63. By doing this, a film of the electrically conductive paste 62 is formed on the upper side of the electrical through wirings 143 and 153.

Such an electrically conductive paste 62 is a liquid composition containing a powder of an electrically conductive material, an organic binder, and a dispersion medium that dissolves or disperses the powder and the organic binder. In the electrically conductive paste 62, the dispersion medium volatilizes and also the organic binder is removed by the below-mentioned firing step, and thus, an electrically conductive film is formed.

Figure 8C:
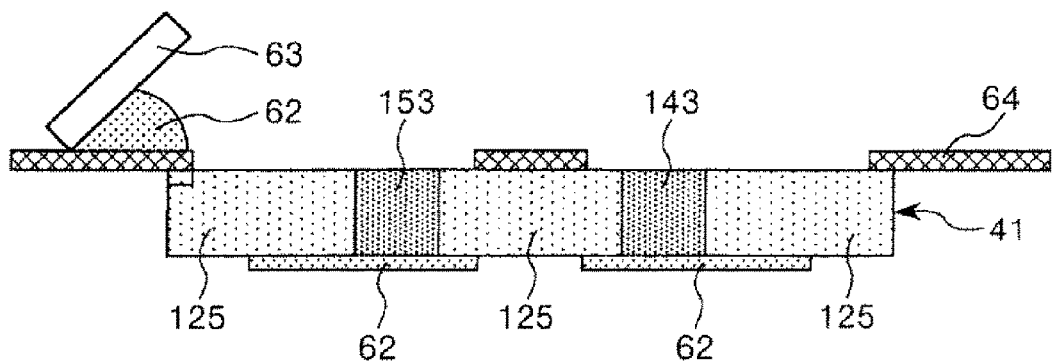

Subsequently, the front and back surfaces of the powder-compacted layer 41 are reversed, and another mask 64 is disposed, and the electrically conductive paste 62 is spread as shown in FIG. 8C. By doing this, a film of the electrically conductive paste 62 is formed on the upper side of the electrical through wirings 143 and 153.

Figure 9A:
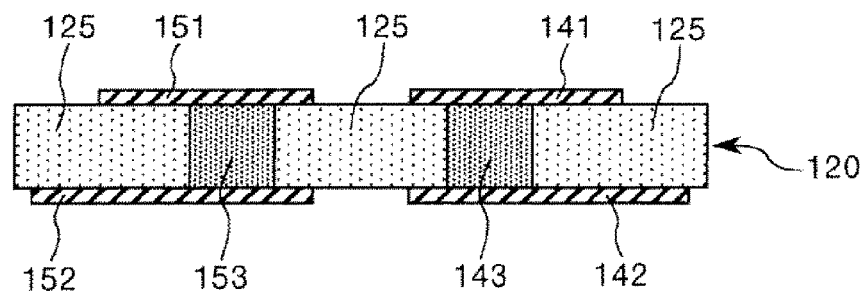
FIGS. 9A to 9C are cross-sectional views for illustrating a method for producing the vibrator shown in FIG. 1 which includes an embodiment of an electrical wiring member production method according to the invention.

Thereafter, the powder-compacted layer 41 having the film of the electrically conductive paste 62 formed therein is fired. By doing this, the organic binder and the dispersion medium in the electrically conductive paste 62 are removed, and the electrically conductive material in the electrically conductive paste 62 is sintered. Thus, as shown in FIG. 9A, the connection electrodes 141 and 151 and the external mounting electrodes 142 and 152 are formed.

This firing is performed at a temperature which is lower than the softening points of both of the first glass material and the second glass material. That is, it is preferred that an electrically conductive paste having a sintering temperature which is lower than the softening points of these glass materials is selected as the electrically conductive paste 62.

[2-3]

Figure 9B:
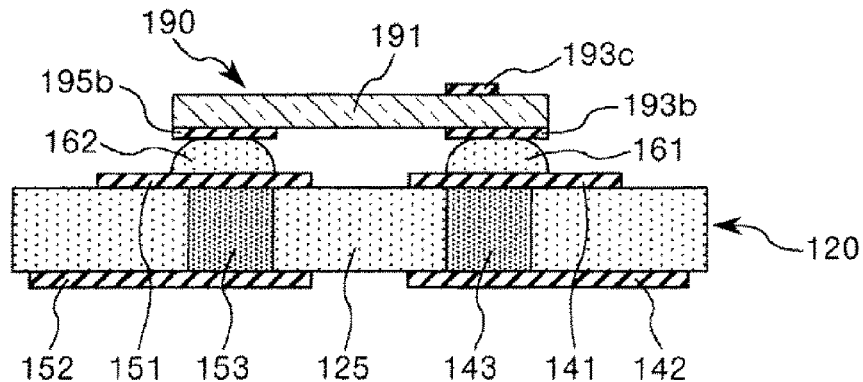

Subsequently, as shown in FIG. 9B, electrically conductive adhesives 161 and 162 are placed on the connection electrodes 141 and 151. Then, a vibrating reed 190 is placed on the electrically conductive adhesives 161 and 162.

Subsequently, a metallization layer (not shown) is formed on the base 120. Similarly, a metallization layer (not shown) is formed also on the lower end surface of a side wall 134 of a lid 130. These metallization layers may be formed before this step. In addition, the metallization layer may be provided as needed, and can also be omitted when the constituent material of the lid 130 is a metal material.

Figure 9C:
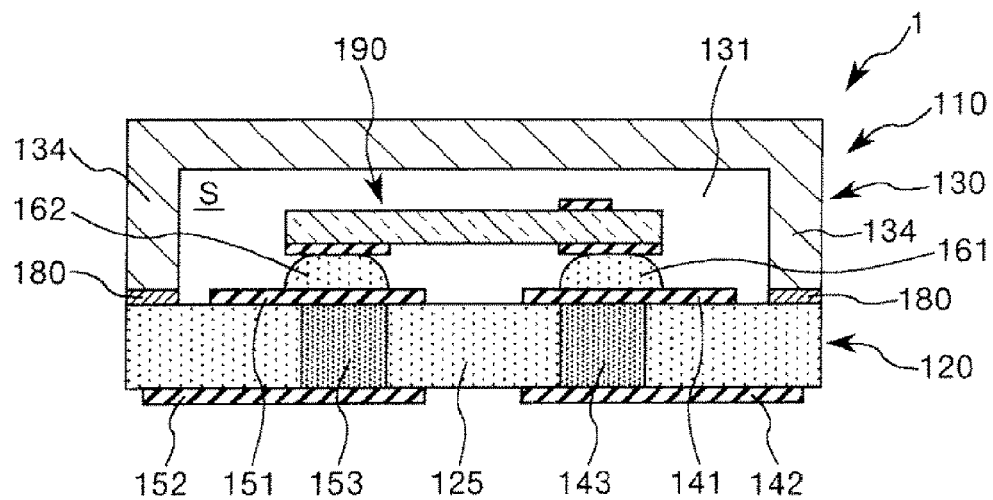

Subsequently, the lid 130 is disposed on the base 120, and the base 120 and the lid 130 are brazed through a brazing material 180. By doing this, the inside of a concave portion 131 of the lid 130 is sealed, and thus is isolated from the outside. In this manner, the vibrator 1 shown in FIG. 9C is obtained. At this time, by filling a work environment with an inert gas or placing the environment under reduced pressure, the housing space S can be maintained in an inert gas-filled state or a reduced pressure state. As a result, the deterioration of the vibrating reed 190 over time can be suppressed.

As described above, the vibrator 1 produced in this manner includes the electrical through wirings 143 and 153 having high electrical conductivity, and therefore has both excellent frequency characteristics and low power consumption.

Second Embodiment

Next, a second embodiment of the electrical wiring member according to the invention will be described.

Figure 10:
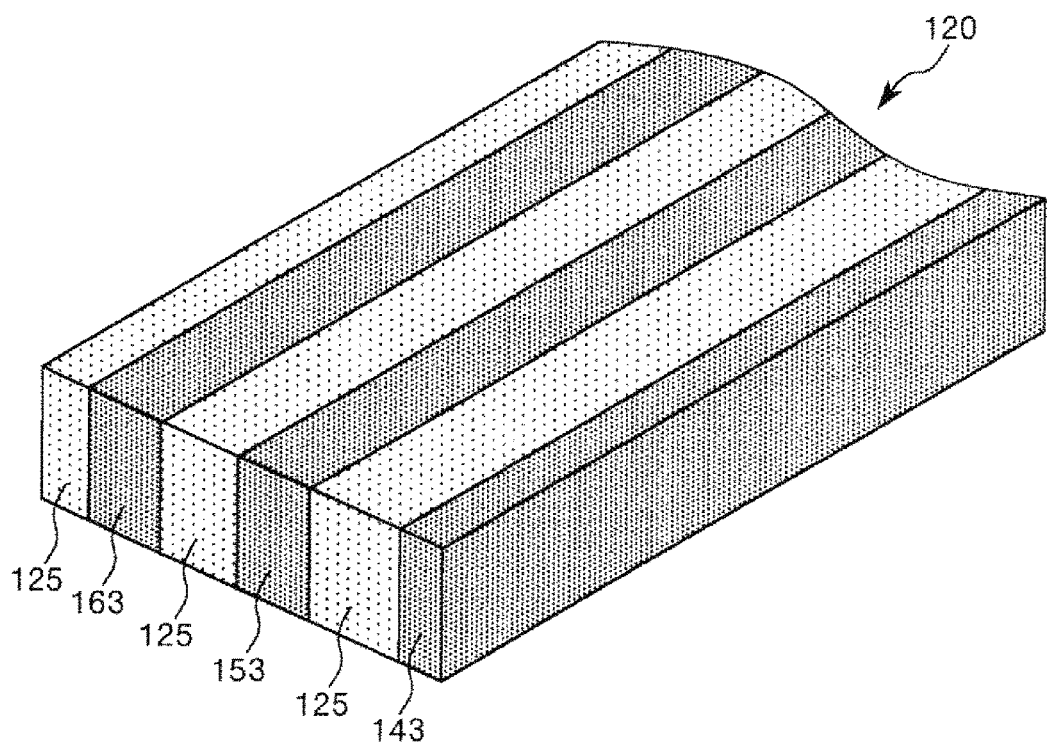
FIG. 10 is a perspective view showing a second embodiment of an electrical wiring member according to the invention.
Figure 11:
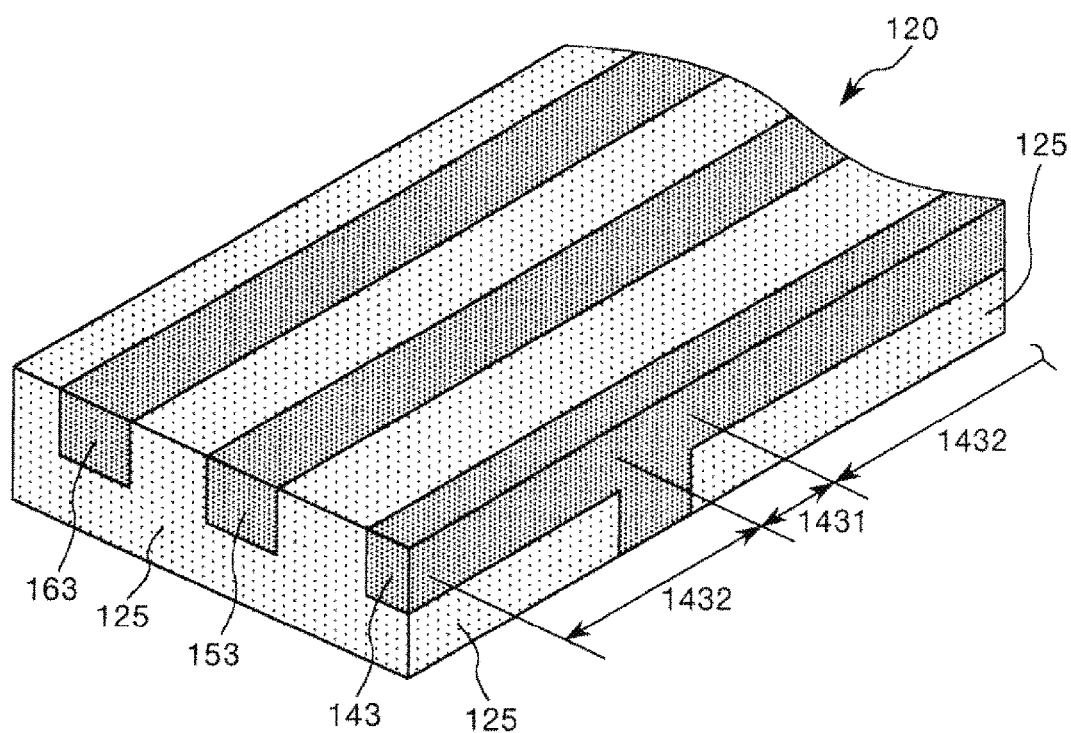
FIG. 11 is a perspective view showing the second embodiment of an electrical wiring member according to the invention.

FIGS. 10 and 11 are perspective views showing the second embodiment of the electrical wiring member according to the invention.

Hereinafter, the second embodiment will be described. However, in the following description, different points from the above-mentioned first embodiment will be mainly described, and the description of the same matter will be omitted. Further, in the drawings, the same components as those in the above-mentioned embodiment will be denoted by the same reference numerals.

The second embodiment is the same as the first embodiment except that the plan-view shapes of electrical through wirings 143, 153, and 163 in a base 120 are different.

The electrical through wirings 143, 153, and 163 shown in FIG. 10 linearly extend along the longitudinal direction of the base 120 and are parallel to each other along a direction perpendicular to the longitudinal direction. Each of the electrical through wirings 143, 153, and 163 can electrically connect two points spaced apart from each other in the longitudinal direction.

In order to form the electrical through wirings 143, 153, and 163, a region where the wirings are to be formed in a powder-compacted layer 41 may be linearly scanned with an energy beam E. By appropriately selecting the scan path, the electrical through wirings 143, 153, and 163 having a desired pattern can be easily produced.

It is also possible to place the base 120 on another insulating substrate and use the resulting substrate as an electrical wiring board.

In addition, the electrical through wirings 143, 153, and 163 shown in FIG. 11 are the same as the electrical through wirings 143, 153, and 163 shown in FIG. 10 except for adopting a configuration in which a portion of each of these wirings in the longitudinal direction passes through the base 120 and the other portion does not pass therethrough.

For convenience of illustration, FIG. 11 shows that only the electrical through wiring 143 includes a through portion 1431 and a non-through portion 1432. By forming the through portion 1431, electrical connection between the front and back surfaces of the base 120 can be achieved.

The through portion 1431 and the non-through portion 1432 can be formed by changing the irradiation energy for the respective portions when the powder-compacted layer 41 is irradiated with the energy beam E.

Specifically, when the through portion 1431 is formed, the irradiation energy is adjusted so that the progress of bonding between the metal particles 31 reaches the back surface of the powder-compacted layer 41. On the other hand, when the non-through portion 1432 is formed, the irradiation energy is adjusted so that the progress of bonding between the metal particles 31 is stopped in the middle of the powder-compacted layer 41 in the thickness direction.

Also in this embodiment, the same operations and effects as those of the first embodiment are obtained.

Electrical Wiring Board

Next, an embodiment of an electrical wiring board according to the invention will be described.

Figure 12:
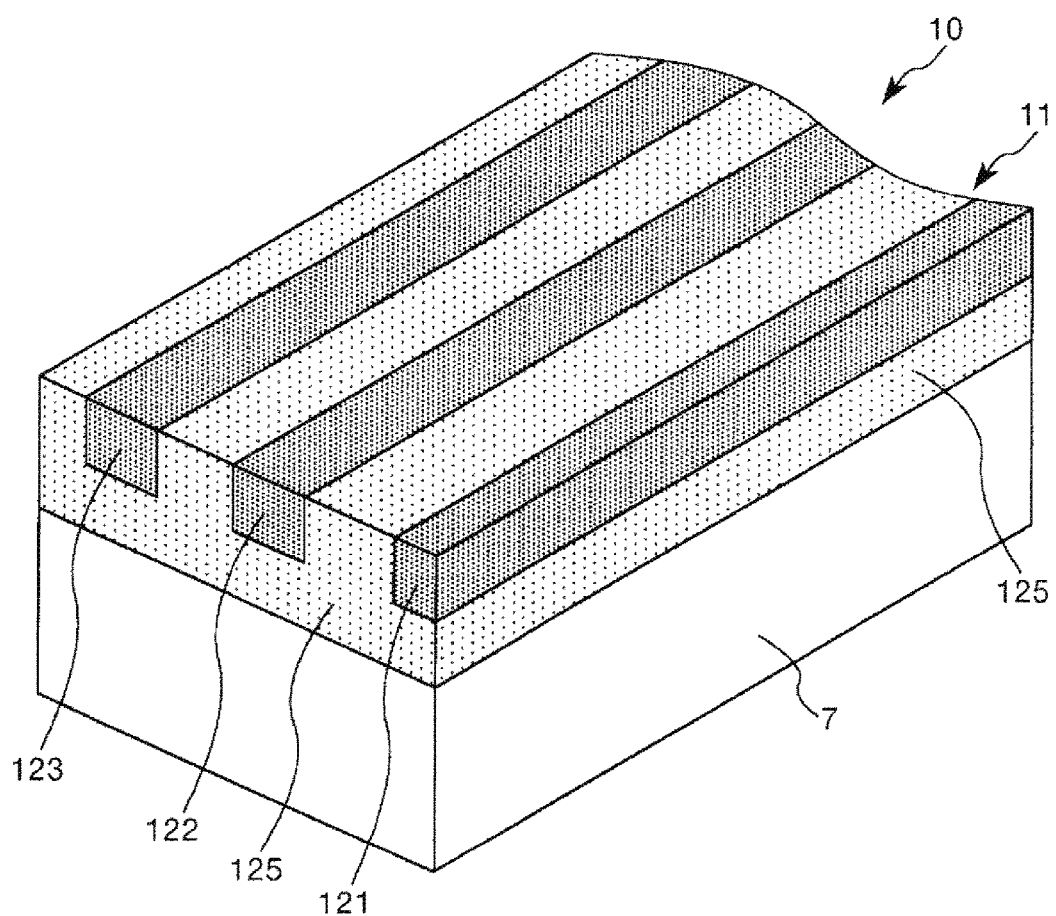
FIG. 12 is a perspective view showing an embodiment of an electrical wiring board according to the invention.
Figure 13:
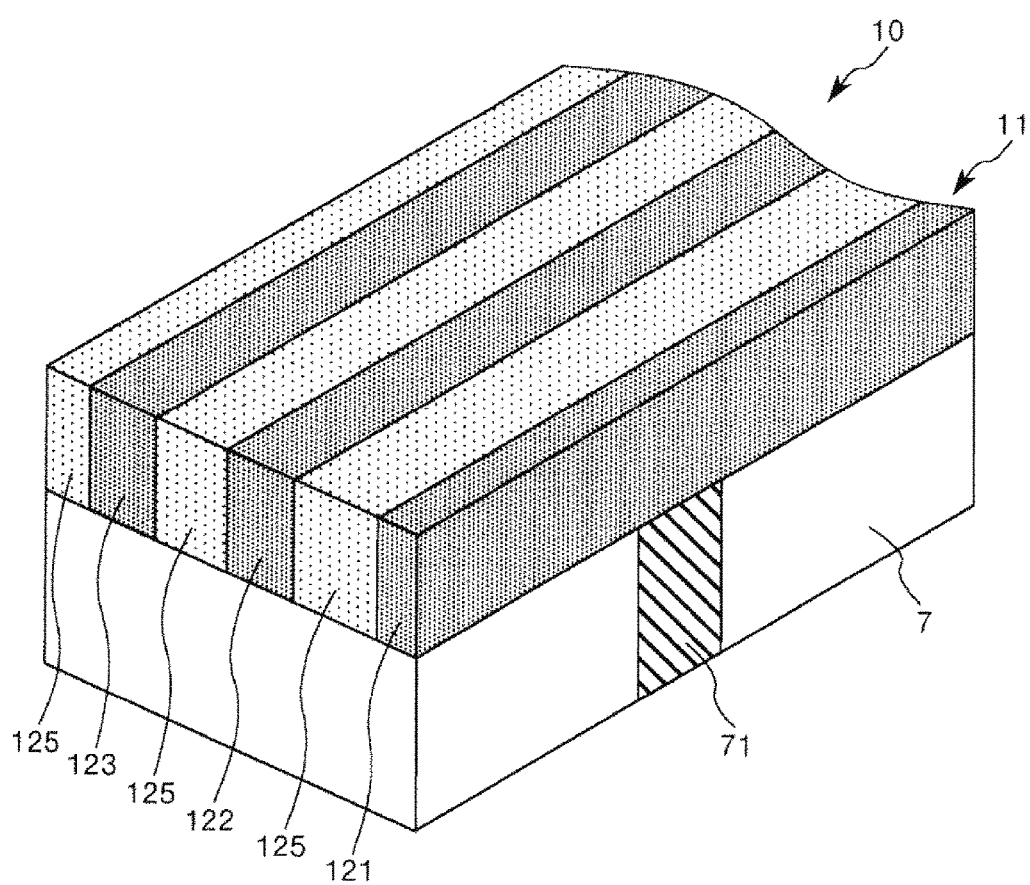
FIG. 13 is a perspective view showing an embodiment of an electrical wiring board according to the invention.

FIGS. 12 and 13 are perspective views each showing an embodiment of an electrical wiring board according to the invention.

An electrical wiring board 10 shown in FIG. 12 includes an insulating substrate 7 and an electrical wiring member 11 which is provided on one surface thereof. The electrical wiring board 10 corresponds to an embodiment of an electrical wiring board according to the invention, and the electrical wiring member 11 corresponds to an embodiment of an electrical wiring member according to the invention.

Hereinafter, an electrical wiring board according to this embodiment will be described. However, in the following description, different points from the electrical wiring member according to the above-mentioned embodiments will be mainly described, and the description of the same matter will be omitted. Further, in the drawings, the same components as those in the above-mentioned embodiments will be denoted by the same reference numerals.

The electrical wiring member 11 has a long shape. The electrical wiring member 11 includes electrical wirings 121, 122, and 123 and an insulating region 125 which is buried between the electrical wirings 121, 122, and 123. Here, the electrical wiring member 11 has the same configuration as the base 120 according to the above-mentioned embodiments, and the electrical wirings 121, 122, and 123 have the same configurations as the electrical through wirings 143, 153, and 163 according to the above-mentioned embodiments.

The electrical wirings 121, 122, and 123 linearly extend along the longitudinal direction of the electrical wiring member 11 and are parallel to each other along a direction perpendicular to the longitudinal direction. Each of the electrical wirings 121, 122, and 123 can electrically connect two points spaced apart from each other in the longitudinal direction.

In the electrical wiring board 10, the insulating substrate 7 and the electrical wiring member 11 are adhered to each other. According to this, the electrical wiring board 10 is supported by the insulating substrate 7, and therefore has excellent mechanical strength.

The constituent material of the insulating substrate 7 is not particularly limited, and may be a resin material, but is preferably constituted by a ceramic material or a glass material. According to this, the electrical wiring board 10 having high heat resistance and low gas absorptivity (gas emissivity) is obtained.

Examples of the ceramic material include various types of ceramics including oxide-based ceramics such as alumina, silica, titania, and zirconia, nitride-based ceramics such as silicon nitride, aluminum nitride, and titanium nitride, carbide-based ceramics such as silicon carbide, and the like.

Further, as the glass material, the above-mentioned materials are used.

In the electrical wiring board 10, the electrical wiring member 11 is supported by the insulating substrate 7. Due to this, even when the thickness of the electrical wiring member 11 is reduced, the mechanical strength of the electrical wiring board 10 as a whole can be ensured.

The thickness of the insulating substrate 7 is appropriately set according to the thickness of the electrical wiring member 11, but is preferably about 20 µm or more and 3000 µm or less.

It is also possible to obtain a laminated electrical wiring board by laminating a plurality of obtained electrical wiring boards 10.

The electrical wiring board 10 shown in FIG. 13 is the same as the electrical wiring board 10 shown in FIG. 12 except that the electrical wirings 121, 122, and 123 pass through the electrical wiring member 11 in the thickness direction and that an electrical through wiring 71 is formed also in the insulating substrate 7.

That is, the electrical wirings 121, 122, and 123 shown in FIG. 13 are configured to pass through the electrical wiring member 11 in the thickness direction. In addition, the insulating substrate 7 is provided with the electrical through wiring 71 in accordance with the positions of the electrical wirings 121, 122, and 123. According to this, the electrical wiring board 10 has an electrically conductive path between one principal surface and the other principal surface.

The electrical through wiring 71 is constituted by an electrically conductive material buried in the insulating substrate 7. The electrically conductive material is, for example, appropriately selected from the same constituent materials of the metal particle 31 described above.

By using the electrical wiring board 10 as shown in FIG. 13, electrical connection between layers becomes possible, and thus, this is suitable for the production of a laminated electrical wiring board.

In this manner, the electrical wiring board 10 including the insulating substrate 7 and the electrical wiring member 11 having the electrical wirings 121, 122, and 123 and the insulating region 125 formed therein is obtained. Since each of the electrical wirings 121, 122, and 123 and the insulating region 125 in the electrical wiring member 11 is formed by modifying a portion of one powder-compacted layer 41, it can be said that the wirings and the region are integrally formed. Due to this, the insulating region 125 and each of the electrical wirings 121, 122, and 123 are rigidly connected to each other, so that the mechanical strength at the boundary between the insulating region 125 and each of the electrical wirings 121, 122, and 123 is sufficiently increased, and thus, the occurrence of a problem such as the peeling-off of the electrical wirings 121, 122, and 123 can be suppressed.

Electrical Wiring Board Production Method

Next, an embodiment of an electrical wiring board production method according to the invention will be described.

Figure 14A:
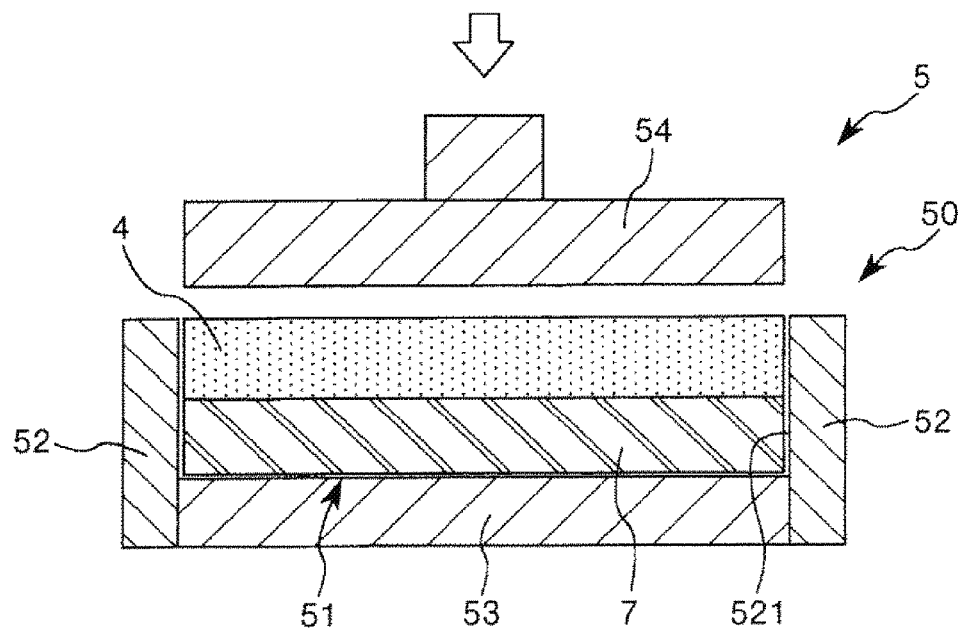
FIGS. 14A and 14B are cross-sectional views showing an embodiment of an electrical wiring board production method according to the invention.
Figure 14B:
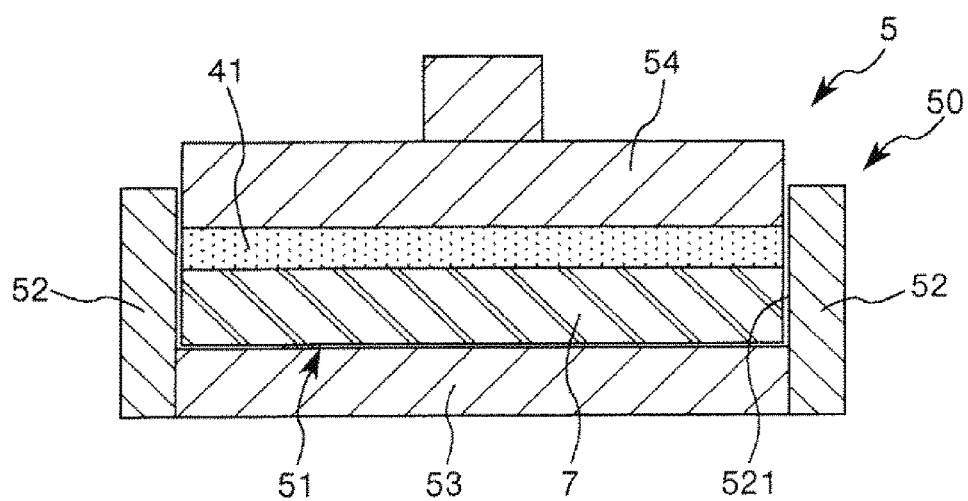

FIGS. 14A and 14B are cross-sectional views showing an embodiment of an electrical wiring board production method according to the invention.

The electrical wiring board production method according to this embodiment is the same as the above-mentioned embodiment of the electrical wiring member production method according to the invention except that an insulating substrate is disposed in the cavity of the press-molding machine.

Hereinafter, the electrical wiring board production method according to this embodiment will be described. However, in the following description, different points from the electrical wiring member production method according to the above-mentioned embodiment will be mainly described, and the description of the same matter will be omitted. In the drawings, the same components as those in the above-mentioned embodiments will be denoted by the same reference numerals.

In this embodiment, first, as shown in FIG. 14A, an insulating substrate 7 is disposed in a cavity 51. Then, by performing molding while performing pressurization, a powder-compacted layer 41 adhered to the insulating substrate 7 is obtained as shown in FIG. 14B.

When the powder-compacted layer 41 adhered to the insulating substrate 7 is heated after releasing the mold or during molding, metal particles with an insulating layer 35 in the powder-compacted layer 41 are fixed to each other, and the insulating substrate 7 and the powder-compacted layer 41 are adhered to each other. This adhesion is performed based on, for example, the adhesive strength of the resin material contained in the insulating substrate 7.

Thereafter, similarly to the above-mentioned embodiments, by irradiating the powder-compacted layer 41 with an energy beam, electrical wirings 121, 122, and 123 are formed.

That is, the powder-compacted layer 41 adhered to the insulating substrate 7 exhibits electrical conductivity by irradiation with an energy beam and thus is capable of forming an electrical wiring, and corresponds to an embodiment of an electrical wiring board forming material according to the invention. In other words, the powder-compacted layer 41 adhered to the insulating substrate 7 has an electrical wiring forming ability so as to be able to form an electrical wiring having a desired pattern only by irradiating an arbitrary region with an energy beam.

Electronic Apparatus

Next, an electronic apparatus (an electronic apparatus according to the invention) which includes the electrical wiring member according to the invention will be described in detail with reference to FIGS. 15 to 17.

Figure 15:
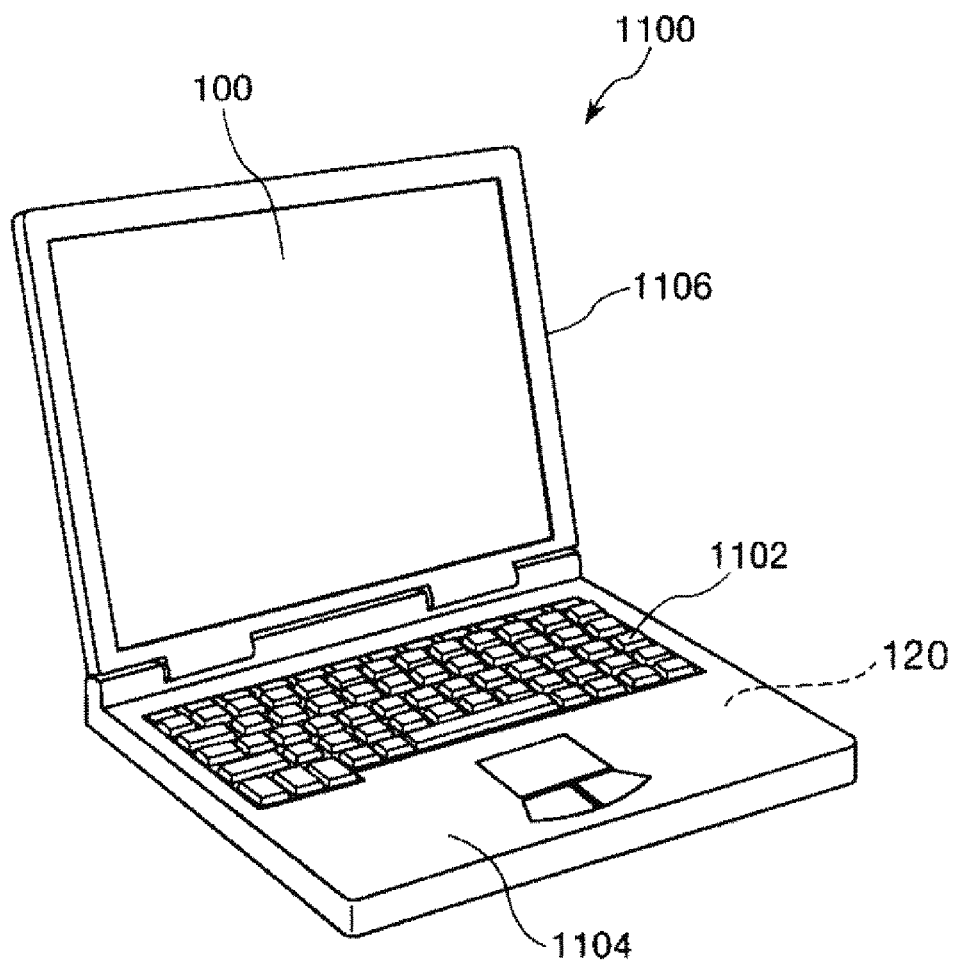
FIG. 15 is a perspective view showing the configuration of a mobile-type (or notebook-type) personal computer to which an electronic apparatus including an electrical wiring member according to the invention is applied.

FIG. 15 is a perspective view showing the configuration of a mobile-type (or notebook-type) personal computer to which an electronic apparatus including the electrical wiring member according to the invention is applied. In the drawing, a personal computer 1100 is configured to include a main body 1104 provided with a keyboard 1102 and a display unit 1106 provided with a display portion 100, and the display unit 1106 is supported rotatably with respect to the main body 1104 through a hinge structure. In such a personal computer 1100, the base 120 (electrical wiring member) having an electrical circuit formed therein is included.

Figure 16:
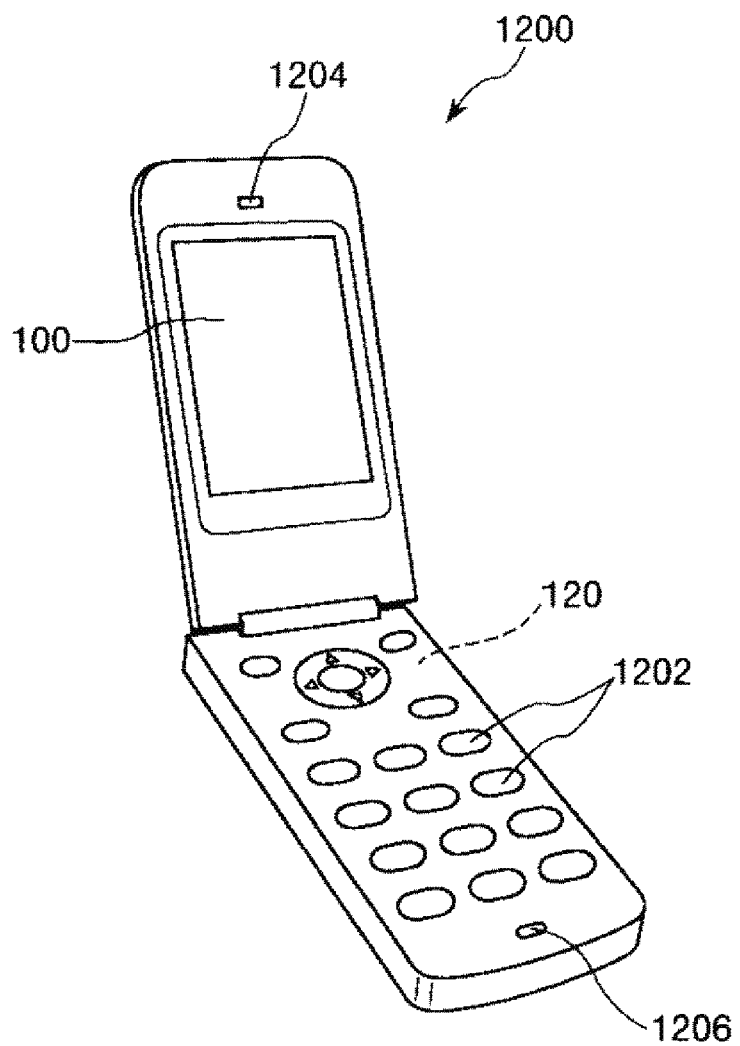
FIG. 16 is a perspective view showing the configuration of a mobile phone (also including a PHS) to which an electronic apparatus including an electrical wiring member according to the invention is applied.

FIG. 16 is a perspective view showing the configuration of a mobile phone (also including a PHS) to which an electronic apparatus including the electrical wiring member according to the invention is applied. In this drawing, a mobile phone 1200 includes a plurality of operation buttons 1202, an earpiece 1204, and a mouthpiece 1206, and a display portion 100 is disposed between the operation buttons 1202 and the earpiece 1204. In such a mobile phone 1200, the base 120 (electrical wiring member) having an electrical circuit formed therein is included.

Figure 17:
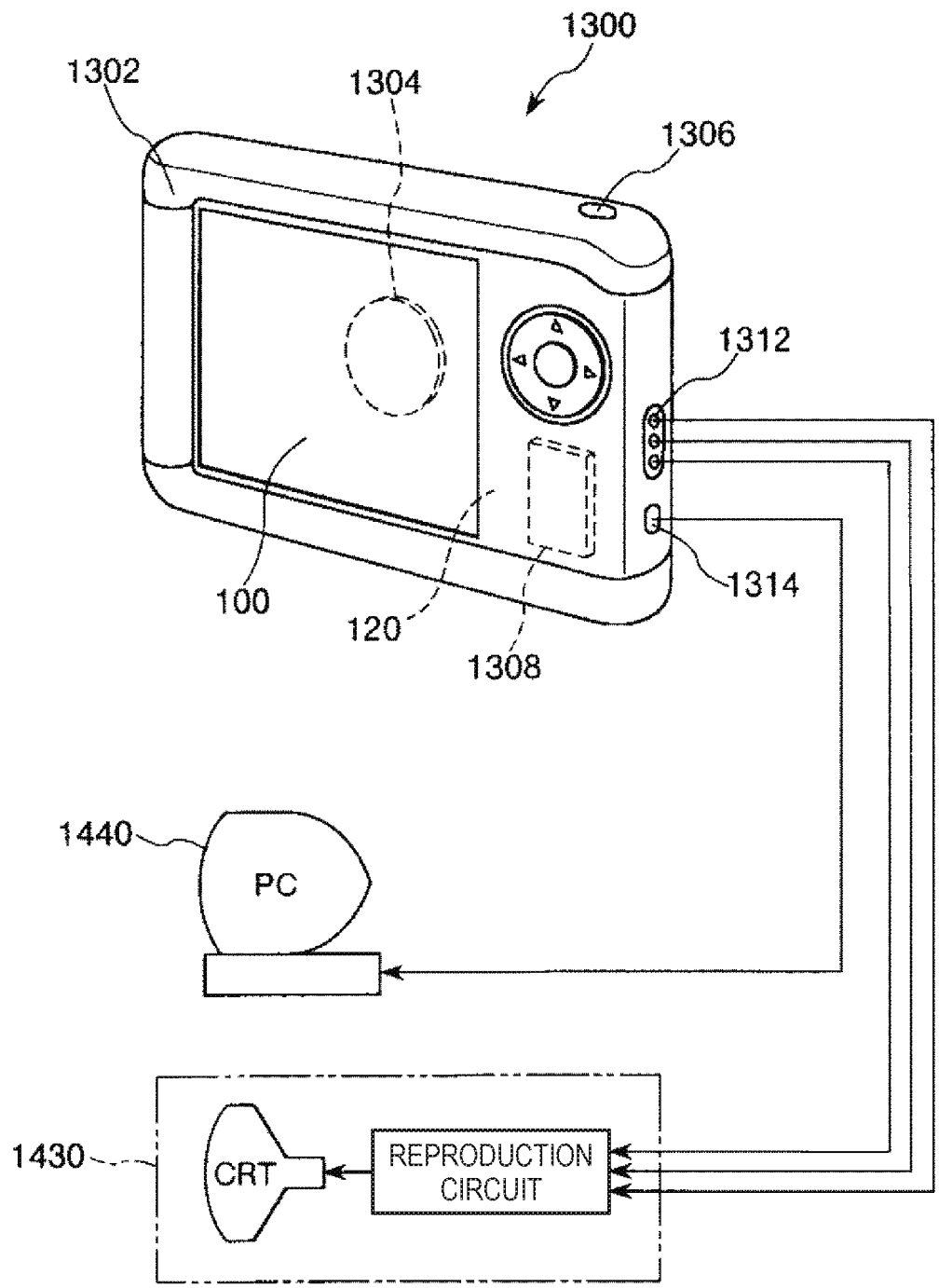
FIG. 17 is a perspective view showing the configuration of a digital still camera to which an electronic apparatus including an electrical wiring member according to the invention is applied.

FIG. 17 is a perspective view showing the configuration of a digital still camera to which an electronic apparatus including the electrical wiring member according to the invention is applied. In this drawing, also connection to an external apparatus is simply shown. Here, a silver halide photographic film is exposed to light according to an optical image of a subject in a common camera, while a digital still camera 1300 generates an imaging signal (image signal) by performing photoelectric conversion of an optical image of a subject using an imaging element such as a charge coupled device (CCD).

A display portion 100 is provided on the back surface of a case (body) 1302 in the digital still camera 1300 and is configured to perform display based on the imaging signal of the CCD. The display portion 100 functions as a viewfinder that displays a subject as an electronic image. In addition, alight receiving unit 1304 including an optical lens (imaging optical system), a CCD, and the like is provided on the front side (back side in the drawing) of the case 1302.

When a photographer checks a subject image displayed on the display portion 100 and presses a shutter button 1306, an imaging signal of the CCD at that time point is transferred to and stored in a memory 1308. In addition, in this digital still camera 1300, a video signal output terminal 1312 and an input/output terminal for data communication 1314 are provided on the side surface of the case 1302. Further, as shown in the drawing, a television monitor 1430 is connected to the video signal output terminal 1312 and a personal computer 1440 is connected to the input/output terminal for data communication 1314 as needed. In addition, it is configured such that an imaging signal stored in the memory 1308 is output to the television monitor 1430 or the personal computer 1440 by a predetermined operation. In such a digital still camera 1300, the base 120 (electrical wiring member) having an electrical circuit formed therein is included.

The electronic apparatus including the electrical wiring member according to the invention can be applied not only to the personal computer (mobile-type personal computer) shown in FIG. 15, the mobile phone shown in FIG. 16, and the digital still camera shown in FIG. 17, but also, for example, to a smartphone, a tablet terminal, a timepiece, an ink jet type discharge apparatus (for example, an ink jet printer), a laptop-type personal computer, a television, a video camera, a video tape recorder, a car navigation apparatus, a pager, an electronic organizer (also including an electronic organizer with a communication function), an electronic dictionary, an electronic calculator, an electronic game machine, a word processor, a workstation, a video phone, a television monitor for crime prevention, electronic binoculars, a POS terminal, a medical device (for example, an electronic thermometer, a sphygmomanometer, a blood sugar meter, an electrocardiographic monitoring device, an ultrasonic diagnostic device, and an electronic endoscope), a fish finder, various measurement apparatuses, meters (for example, meters for vehicles, aircrafts, and ships), a flight simulator, and the like.

Moving Object

Next, a moving object (a moving object according to the invention) which includes the electrical wiring member according to the invention will be described.

Figure 18:
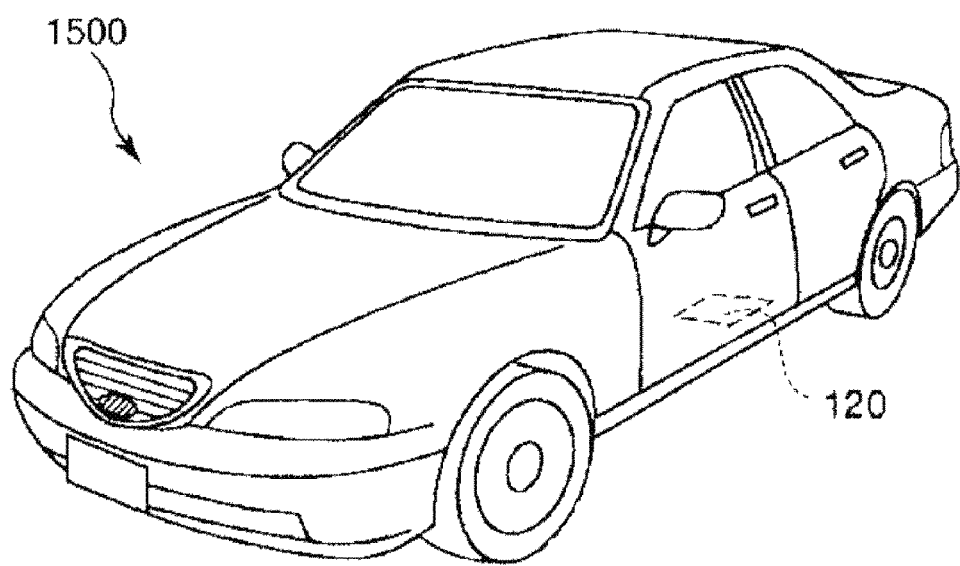
FIG. 18 is a perspective view schematically showing a car as an example of a moving object according to the invention.

FIG. 18 is a perspective view schematically showing a car as an example of the moving object according to the invention. A base 120 (electrical wiring member) having an electrical circuit formed therein is mounted in a car 1500. The base 120 can be widely applied to an electronic control unit (ECU) such as a keyless entry, an immobilizer, a car navigation system, a car air conditioner, an anti-lock brake system (ABS), an airbag, a tire pressure monitoring system (TPMS), an engine control, a battery monitor for a hybrid car or an electrical car, and a car body posture control system.

Hereinabove, the invention has been described with reference to the preferred embodiments, however, the invention is not limited thereto, and the configuration of each portion may be replaced with an arbitrary configuration having the same function.

Further, in the invention, an arbitrary component may be added to the above-mentioned embodiments, and the embodiments may be appropriately combined with each other.

In addition, the application of the electrical wiring member according to the invention is not limited to the application that requires airtightness, that is, the application to a vibrator.

Examples

Next, specific examples of the invention will be described.
1. Preparation of Sample
Sample 1

[1] First, a metal powder (metal particles) of an Fe-3.5Si-4.5Cr-based alloy produced by a water atomization method was prepared. This metal powder is an Fe-based alloy powder containing 4.5 mass % of Cr and 3.5 mass % of Si. The average particle diameter of the metal powder was 10 μm.

Further, a powder (first glass powder) of a phosphate-based glass (first glass material) containing tin oxide was prepared. This powder is a powder of a $SnO-P_2O5-MgO$-based glass. The average particle diameter of the first glass powder was 3 μm and the softening point of the first glass material was 390° C.

Subsequently, this metal powder and the first glass powder were put into a friction mixer, thereby generating a mechanical compressive frictional action. By doing this, the first glass material was attached to the surfaces of the metal particles, whereby metal particles with an insulating layer were obtained.

The average thickness of the surface insulating layer obtained by calculation was 60 nm.

Subsequently, the obtained metal particles with an insulating layer, an epoxy resin, and toluene were mixed, whereby a mixture was obtained. The addition amount of the epoxy resin was set to 1 part by mass with respect to 100 parts by mass of the metal particles.

The mixture was dried, and then, crushed, whereby a mixed powder was obtained.

[2] Subsequently, the obtained mixed powder was molded using a press-molding machine. By doing this, a plate-shaped powder-compacted layer was obtained. The obtained powder-compacted layer had a disk shape with a diameter of 40 mm and a thickness of 1 mm. Further, the molding pressure was 10 MPa (0.1 t/cm$^2$).

Subsequently, the obtained powder-compacted layer was heated. By doing this, the resin material was melted, and thereafter, the resin material was cured, whereby the powder-compacted layer was solidified. At this time, the heating temperature was 150° C., the heating time was 0.75 hours, and the heating atmosphere was an air atmosphere.

[3] Subsequently, in the obtained powder-compacted layer, regions (two places) where electrical through wirings were to be formed were irradiated with a laser. Further, a linear region that connects these two places was also irradiated with a laser. By doing this, metal particles in the irradiated regions were bonded to each other, whereby electrical conductivity was exhibited. As a result, two electrical through wirings and an electrical wiring that electrically connects these wirings were formed.

The plan-view shape of each electrical through wiring was set to a square with a side length of 15 mm. Then, a region having such a plan-view shape was irradiated with a laser and the bonding of the metal particles was allowed to proceed until the powder-compacted layer was penetrated, whereby the electrical through wiring was obtained. Further, a 20-mm interval was provided between these electrical through wirings.

On the other hand, the plan-view shape of the electrical wiring that connects these electrical through wirings was set to a rectangle with a length of 20 mm and a width of 0.5 mm.

Further, as the laser oscillation source, a YAG laser was used, and the wavelength of the oscillated laser was set to 1064 nm.

In this manner, a sample including the electrical through wirings was obtained.
Samples 2 to 5

Each sample including electrical through wirings was obtained in the same manner as Sample 1 except that the mass ratio of the insulating material to the metal powder in the interparticle insulating portion was changed by changing the addition amount of the epoxy resin.
Samples 6 and 7

Each sample including electrical through wirings was obtained in the same manner as Sample 1 except that a silicone resin at a mass ratio shown in Table 1 was used in place of the epoxy resin.
Sample 8

A sample including electrical through wirings was obtained in the same manner as Sample 2 except that the first glass material was changed to a $Bi_2O3-B2O3-ZnO$-based glass.
Sample 9

A sample including electrical through wirings was obtained in the same manner as Sample 2 except that the first glass material was changed to a water glass ($Na_2O-SiO2$).
Sample 10

A sample including electrical through wirings was obtained in the same manner as Sample 7 except that the first glass material was changed to a water glass ($Na_2O-SiO2$).
Sample 11

A sample including electrical through wirings was obtained in the same manner as Sample 1 except that the material of the metal particles was changed to Cu, and also the first glass material was changed to a $Bi_2O3-B2O3-ZnO$-based glass. Incidentally, the average particle diameter of the metal particles was 5.5 μm.
Samples 12 to 15

Each sample including electrical through wirings was obtained in the same manner as Sample 11 except that the mass ratio of the insulating material to the metal powder in the interparticle insulating portion was changed by changing the addition amount of the epoxy resin.
Samples 16 and 17

Each sample including electrical through wirings was obtained in the same manner as Sample 11 except that a silicone resin at a mass ratio shown in Table 1 was used in place of the epoxy resin.

Sample 18

A sample including electrical through wirings was obtained in the same manner as Sample 12 except that the first glass material was changed to a SnO—P$_2$O5-MgO-based glass.

Sample 19

A sample including electrical through wirings was obtained in the same manner as Sample 12 except that the first glass material was changed to a water glass (Na$_2$O—SiO2).

Sample 20

A sample including electrical through wirings was obtained in the same manner as Sample 17 except that the first glass material was changed to a water glass (Na$_2$O—SiO2).

Sample 21

A sample including electrical through wirings was obtained in the same manner as Sample 1 except that Cu particles having an average particle diameter of 8 μm were used, the first glass material was changed to a SiO$_2$—Al2O3-B2O3-based glass, and also the interparticle insulating portion was constituted by 0.5 parts by mass of an epoxy resin and 0.25 parts by mass of a second glass powder with respect to 100 parts by mass of a metal powder.

Incidentally, as the second glass powder, the same type as the first glass powder was used.

Sample 22

A sample including electrical through wirings was obtained in the same manner as Sample 21 except that the mass ratio of the insulating material to the metal powder in the interparticle insulating portion was changed by changing the addition amount of the epoxy resin.

Sample 23

A sample including electrical through wirings was obtained in the same manner as Sample 21 except that the mass ratio of the insulating material to the metal powder in the interparticle insulating portion was changed by changing the addition amount of the epoxy resin, and also the second glass powder of a different material from that of the first glass powder was used.

Incidentally, as the second glass powder, a powder of a SnO—P$_2$O5-MgO-based glass having an average particle diameter of 3 μm was used.

Sample 24

A sample including electrical through wirings was obtained in the same manner as Sample 1 except that Cu particles having an average particle diameter of 12 μm were used, the first glass material was changed to a SiO$_2$—B2O3-ZnO-based glass, and also the interparticle insulating portion was constituted by 8 parts by mass of an epoxy resin and 0.25 parts by mass of a second glass powder with respect to 100 parts by mass of a metal powder.

Incidentally, as the second glass powder, the same type as the first glass powder was used.

Sample 25

A sample including electrical through wirings was obtained in the same manner as Sample 24 except that the addition amount of the second glass powder was changed as shown in Table 2.

Sample 26

A sample including electrical through wirings was obtained in the same manner as Sample 24 except that the second glass powder was changed to a powder of a SnO—P$_2$O5-MgO-based glass having an average particle diameter of 3 μm.

Sample 27

A sample including electrical through wirings was obtained in the same manner as Sample 1 except that Cu particles having an average particle diameter of 10 μm were used, the first glass material was changed to a SnO—P$_2$O5-MgO-based glass, and also the interparticle insulating portion was constituted by 15 parts by mass of an epoxy resin and 0.25 parts by mass of a second glass powder with respect to 100 parts by mass of a metal powder.

Incidentally, as the second glass powder, the same type as the first glass powder was used.

Sample 28

A sample including electrical through wirings was obtained in the same manner as Sample 27 except that a powder of a Bi$_2$O3-B2O3-ZnO-based glass having an average particle diameter of 2 μm was used as the second glass powder, and also the addition amount thereof was changed as shown in Table 2.

Sample 29

Metal particles with an insulating layer were obtained by putting polypropylene particles in place of the first glass powder. The average thickness of the insulating layer was 200 nm, and the softening point of polypropylene was 150° C.

Subsequently, the metal particles with an insulating layer were molded using a press-molding machine in the same manner as Sample 1.

Subsequently, in the obtained powder-compacted layer, regions where electrical through wirings were to be formed were irradiated with a laser. By doing this, a sample including electrical through wirings was obtained.

Incidentally, the detailed production conditions are as shown in Table 2.

Sample 30

A sample including electrical through wirings was obtained in the same manner as Sample 29 except that the production conditions were changed as shown in Table 2.

Sample 31

Metal particles with an insulating layer were obtained by putting polypropylene particles in place of the first glass powder. The average thickness of the insulating layer was 350 nm, and the softening point of polypropylene was 150° C.

Subsequently, a mixed powder of the metal particles with an insulating layer and polypropylene particles was molded using a press-molding machine in the same manner as Sample 1.

Subsequently, in the obtained powder-compacted layer, regions where electrical through wirings were to be formed were irradiated with a laser. By doing this, a sample including electrical through wirings was obtained.

Incidentally, the detailed production conditions are as shown in Table 2.

Sample 32

A sample including electrical through wirings was obtained in the same manner as Sample 31 except that the production conditions were changed as shown in Table 2.

Sample 33

A sample including electrical through wirings was obtained in the same manner as Sample 2 except that the formation of the surface insulating layer was omitted.

Sample 34

A sample including electrical through wirings was obtained in the same manner as Sample 7 except that the formation of the surface insulating layer was omitted.

The production conditions for the respective samples are shown in Tables 1 and 2. Among the samples shown in Tables 1 and 2, the sample which corresponds to the invention is indicated by "Example", and the sample which does not correspond to the invention is indicated by "Comparative Example".

TABLE 1

Production conditions for sample including electrical through wirings

| | | Metal particles | | Surface insulating layer | | | Interparticle insulating portion | | |
| | | Material | Average particle diameter μm | Material | Softening point of first glass material ° C. | Average particle diameter of first glass powder μm | Average thickness nm | Material | Mass ratio Parts by mass | Remarks |
|---|---|---|---|---|---|---|---|---|---|---|
| Sample 1 | Example | Fe—Si—Cr | 10 | SnO—P$_2$O$_5$—MgO | 390 | 3.0 | 60 | Epoxy resin | 1 | |
| Sample 2 | Example | Fe—Si—Cr | 10 | SnO—P$_2$O$_5$—MgO | 390 | 3.0 | 60 | Epoxy resin | 2 | |
| Sample 3 | Example | Fe—Si—Cr | 10 | SnO—P$_2$O$_5$—MgO | 390 | 3.0 | 60 | Epoxy resin | 5 | |
| Sample 4 | Example | Fe—Si—Cr | 10 | SnO—P$_2$O$_5$—MgO | 390 | 3.0 | 60 | Epoxy resin | 10 | |
| Sample 5 | Example | Fe—Si—Cr | 10 | SnO—P$_2$O$_5$—MgO | 390 | 3.0 | 60 | Epoxy resin | 20 | |
| Sample 6 | Example | Fe—Si—Cr | 10 | SnO—P$_2$O$_5$—MgO | 390 | 3.0 | 60 | Silicone resin | 2 | |
| Sample 7 | Example | Fe—Si—Cr | 10 | SnO—P$_2$O$_5$—MgO | 390 | 3.0 | 60 | Silicone resin | 5 | |
| Sample 8 | Example | Fe—Si—Cr | 10 | Bi$_2$O$_3$—B$_2$—O$_3$—ZnO | 405 | 2.0 | 30 | Epoxy resin | 2 | |
| Sample 9 | Example | Fe—Si—Cr | 10 | Water glass | 600 | 50 | 100 | Epoxy resin | 2 | |
| Sample 10 | Example | Fe—Si—Cr | 10 | Water glass | 600 | 50 | 100 | Silicone resin | 5 | |
| Sample 11 | Example | Cu | 5.5 | Bi$_2$O$_3$—B$_2$—O$_3$—ZnO | 405 | 2.0 | 45 | Epoxy resin | 1 | |
| Sample 12 | Example | Cu | 5.5 | Bi$_2$O$_3$—B$_2$—O$_3$—ZnO | 405 | 2.0 | 45 | Epoxy resin | 2 | |
| Sample 13 | Example | Cu | 5.5 | Bi$_2$O$_3$—B$_2$—O$_3$—ZnO | 405 | 2.0 | 45 | Epoxy resin | 5 | |
| Sample 14 | Example | Cu | 5.5 | Bi$_2$O$_3$—B$_2$—O$_3$—ZnO | 405 | 2.0 | 45 | Epoxy resin | 10 | |
| Sample 15 | Example | Cu | 5.5 | Bi$_2$O$_3$—B$_2$—O$_3$—ZnO | 405 | 2.0 | 45 | Epoxy resin | 20 | |
| Sample 16 | Example | Cu | 5.5 | Bi$_2$O$_3$—B$_2$—O$_3$—ZnO | 405 | 2.0 | 45 | Silicone resin | 2 | |
| Sample 17 | Example | Cu | 5.5 | Bi$_2$O$_3$—B$_2$—O$_3$—ZnO | 405 | 2.0 | 45 | Silicone resin | 5 | |
| Sample 18 | Example | Cu | 5.5 | SnO—P$_2$O$_5$—MgO | 390 | 3.0 | 60 | Epoxy resin | 2 | |
| Sample 19 | Example | Cu | 5.5 | Water glass | 600 | 50 | 100 | Epoxy resin | 2 | |
| Sample 20 | Example | Cu | 5.5 | Water glass | 600 | 50 | 100 | Silicone resin | 5 | |

TABLE 2

Production conditions for sample including electrical through wirings

| | | Metal particles | | Surface insulating layer | | | Interparticle insulating portion | | |
| | | Material | Average particle diameter μm | Material | Softening point of first glass material ° C. | Average particle diameter of first glass powder μm | Average thickness nm | Material | Mass ratio Parts by mass | Remarks |
|---|---|---|---|---|---|---|---|---|---|---|
| Sample 21 | Example | Cu | 8 | SnO—P$_2$O$_5$—MgO | 660 | 3.5 | 55 | Epoxy resin | 0.5 | containing 0.25 parts by mass of second glass powder of the same type as first glass powder |
| Sample 22 | Example | Cu | 8 | SnO—P$_2$O$_5$—MgO | 660 | 3.5 | 55 | Epoxy resin | 0.75 | containing 0.25 parts by mass of second glass powder of the same type as first glass powder |
| Sample 23 | Example | Cu | 8 | SnO—P$_2$O$_5$—MgO | 660 | 3.5 | 55 | Epoxy resin | 1.5 | containing 0.25 parts by mass of second glass powder of different type from first glass powder |
| Sample 24 | Example | Cu | 12 | SnO—P$_2$O$_5$—MgO | 540 | 4.5 | 120 | Epoxy resin | 8 | containing 0.25 parts by mass of second glass powder of the same type as first glass powder |

TABLE 2-continued

Production conditions for sample including electrical through wirings

| | | Metal particles | | Surface insulating layer | | | Interparticle insulating portion | | |
|---|---|---|---|---|---|---|---|---|---|
| | | Material | Average particle diameter μm | Material | Softening point of first glass material °C. | Average particle diameter of first glass powder μm | Average thickness nm | Material | Mass ratio Parts by mass | Remarks |
| Sample 25 | Example | Cu | 12 | SnO—P$_2$O$_5$—MgO | 540 | 4.5 | 120 | Epoxy resin | 8 | containing 0.5 parts by mass of second glass powder of the same type as first glass powder |
| Sample 26 | Example | Cu | 12 | SnO—P$_2$O$_5$—MgO | 540 | 4.5 | 120 | Epoxy resin | 8 | containing 0.25 parts by mass of second glass powder of different type from first glass powder |
| Sample 27 | Example | Cu | 10 | SnO—P$_2$O$_5$—MgO | 390 | 3.0 | 60 | Epoxy resin | 15 | containing 0.25 parts by mass of second glass powder of same type as first glass powder |
| Sample 28 | Example | Cu | 10 | SnO—P$_2$O$_5$—MgO | 390 | 3.0 | 60 | Epoxy resin | 15 | containing 0.5 parts by mass of second glass powder of different type from first glass powder |
| Sample 29 | Comparative example | Fe—Si—Cr | 10 | Polypropylene | 150 | — | 200 | — | 0 | |
| Sample 30 | Comparative example | Cu | 5.5 | Polypropylene | 150 | — | 100 | — | 0 | |
| Sample 31 | Comparative example | Fe—Si—Cr | 10 | Polypropylene | 150 | — | 350 | Polypropylene | 10 | |
| Sample 32 | Comparative example | Cu | 5.5 | Polypropylene | 150 | — | 175 | Polypropylene | 10 | |
| Sample 33 | Comparative example | Fe—Si—Cr | 10 | — | — | — | — | Epoxy resin | 2 | |
| Sample 34 | Comparative example | Cu | 5.5 | — | — | — | — | Silicone resin | 5 | |

2. Evaluation of Sample 2.1 Evaluation of Electrical Conductivity

First, with respect to the samples obtained in the respective Examples and Comparative Examples, the resistance value of the electrical through wiring was measured by a four-terminal method. Then, the electrical conductivity was evaluated according to the following evaluation criteria. In the measurement, a digital multimeter was used, and the applied electrical current was set to 1 mA.

Evaluation Criteria for Electrical Conductivity

A: The resistance value is extremely small (less than 5 mΩ).

B: The resistance value is small (5 mΩ or more and less than 25 mΩ).

C: The resistance value is slightly small (25 mΩ or more and less than 50 mΩ).

D: The resistance value is slightly large (50 mΩ or more and less than 75 mΩ).

E: The resistance value is large (75 mΩ or more and less than 100 mΩ).

F: The resistance value is extremely large (100 mΩ or more).

2.2 Evaluation of Insulating Properties

Subsequently, with respect to the samples obtained in the respective Examples and Comparative Examples, a soldering operation using a Pb—Sn eutectic solder (melting point: 186° C.) was performed for the electrical through wiring. Then, the insulation resistance of an insulating region in the vicinity of the electrical through wiring after the operation was measured using a tester. Then, the insulating properties were evaluated according to the following evaluation criteria.

Evaluation Criteria for Insulating Properties

A: The resistance value is extremely large ($1 \times 10^{13}$ Ω or more)

B: The resistance value is large ($1\times10^{12}\Omega$ or more and less than $1\times10^{13}\Omega$).

C: The resistance value is slightly large ($1\times10^{11}\Omega$ or more and less than $1\times10^{12}\Omega$).

D: The resistance value is slightly small ($1\times10^{10}\Omega$ or more and less than $1\times10^{11}\Omega$).

E: The resistance value is small ($1\times10^{9}\Omega$ or more and less than $1\times10^{10}\Omega$).

F: The resistance value is extremely small (less than $1\times10^{9}\Omega$).

2.3 Evaluation of Mechanical Strength

Subsequently, with respect to the samples obtained in the respective Examples and Comparative Examples, the folding endurance strength was measured in accordance with the test method specified in JIS C 5016. Then, the folding endurance strength of Sample 29 was assumed to be 1, and the relative value of the folding endurance strength of each sample was obtained and evaluated according to the following evaluation criteria.

Evaluation Criteria for Mechanical Strength

A: The relative value of the folding endurance strength is 5 or more.

B: The relative value of the folding endurance strength is 4 or more and less than 5.

C: The relative value of the folding endurance strength is 3 or more and less than 4.

D: The relative value of the folding endurance strength is 2 or more and less than 3.

E: The relative value of the folding endurance strength is more than 1 and less than 2.

F: The relative value of the folding endurance strength is 1 or less.

The above evaluation results are shown in Tables 3 and 4.

TABLE 3

| | | Evaluation results | | |
|---|---|---|---|---|
| | | Electrical conductivity | Insulating properties | Mechanical strength |
| Sample 1 | Example | A | A | A |
| Sample 2 | Example | A | A | A |
| Sample 3 | Example | A | A | A |
| Sample 4 | Example | B | A | B |
| Sample 5 | Example | B | A | C |
| Sample 6 | Example | A | A | A |
| Sample 7 | Example | A | A | A |
| Sample 8 | Example | A | A | A |
| Sample 9 | Example | A | A | A |
| Sample 10 | Example | A | A | A |
| Sample 11 | Example | A | A | A |
| Sample 12 | Example | A | A | A |
| Sample 13 | Example | A | A | A |
| Sample 14 | Example | B | A | B |
| Sample 15 | Example | B | A | C |
| Sample 16 | Example | A | A | A |
| Sample 17 | Example | A | A | A |
| Sample 18 | Example | A | A | A |
| Sample 19 | Example | A | A | A |
| Sample 20 | Example | A | A | A |

TABLE 4

| | | Evaluation results | | |
|---|---|---|---|---|
| | | Electrical conductivity | Insulating properties | Mechanical strength |
| Sample 21 | Example | A | B | B |
| Sample 22 | Example | A | A | B |
| Sample 23 | Example | A | A | A |
| Sample 24 | Example | A | A | A |
| Sample 25 | Example | B | A | A |
| Sample 26 | Example | A | A | A |
| Sample 27 | Example | B | A | A |
| Sample 28 | Example | B | A | A |
| Sample 29 | Comparative example | B | F | F |
| Sample 30 | Comparative example | B | F | F |
| Sample 31 | Comparative example | B | F | E |
| Sample 32 | Comparative example | B | F | E |
| Sample 33 | Comparative example | A | F | B |
| Sample 34 | Comparative example | A | F | B |

As is apparent from Tables 3 and 4, it was confirmed that the respective samples obtained in Examples have excellent characteristics as an electrical wiring member.

What is claimed is:

1. An electrical wiring member production method, comprising:
    preparing a composition that contains a resin material and metal particles with an insulating layer, the metal particles with the insulating layer being formed by:
        preparing the metal particles having electrical conductivity; and
        placing the insulating layer on an outer surface of each of the metal particles, the insulating layer being made of a glass material as a main material;
    molding the composition so as to form a molded body; and
    irradiating the molded body with an energy beam so that the irradiated region becomes an electrical wiring.

2. The electrical wiring member production method according to claim 1,
    wherein the metal particles with the insulating layer are produced by fixing the glass material on the outer surface of each of the metal particles.

3. The electrical wiring member production method according to claim 1,
    wherein the molded body is obtained by pressurizing a mixture of the metal particles with the insulating layer and the resin material in the molding.

4. The electrical wiring member production method according to claim 1,
    wherein the metal particles are produced by one of a water atomization method or a spinning water atomization method.

5. The electrical wiring member production method according to claim 1, wherein the resin material contains an epoxy-based resin.

6. The electrical wiring member production method according to claim 1, further comprising:
    heating the molded body before the irradiating.

7. The electrical wiring member production method according to claim 6, wherein the heating is performed both during and after the molding.

8. The electrical wiring member production method according to claim 6, wherein a heating temperature of the heating is 130° C. or higher and 180° C. or lower.

9. The electrical wiring member production method according to claim 6, wherein a heating time of the heating is 5 minutes or more and 2 hours or less.

* * * * *